US012218222B2

(12) United States Patent
Lee et al.

(10) Patent No.: US 12,218,222 B2
(45) Date of Patent: Feb. 4, 2025

(54) FINFET DEVICE AND METHOD OF FORMING SAME

(71) Applicant: Taiwan Semiconductor Manufacturing Co., Ltd., Hsinchu (TW)

(72) Inventors: Chien-Wei Lee, Kaohsiung (TW); Che-Yu Lin, Hsinchu (TW); Hsueh-Chang Sung, Zhubei (TW); Yee-Chia Yeo, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/805,581

(22) Filed: Jun. 6, 2022

(65) Prior Publication Data

US 2022/0302282 A1    Sep. 22, 2022

Related U.S. Application Data

(62) Division of application No. 16/458,571, filed on Jul. 1, 2019, now Pat. No. 11,355,620.

(Continued)

(51) Int. Cl.
*H01L 29/66* (2006.01)
*H01J 37/32* (2006.01)
(Continued)

(52) U.S. Cl.
CPC .. *H01L 29/66795* (2013.01); *H01J 37/32724* (2013.01); *H01L 21/02057* (2013.01);
(Continued)

(58) Field of Classification Search
CPC ........ H01L 29/66795; H01L 21/02057; H01L 21/3065; H01L 21/67069; H01J 37/32724;
(Continued)

(56) References Cited

U.S. PATENT DOCUMENTS 9,508,556 B1    11/2016  Tsai et al.
2008/0078744 A1*  4/2008  Wang ................ H01J 37/32834
                                                              438/689

(Continued)

FOREIGN PATENT DOCUMENTS

KR    20100033328 A    3/2010
KR    20160001672 A    1/2016
(Continued)

*Primary Examiner* — Brian Turner
(74) *Attorney, Agent, or Firm* — Slater Matsil, LLP

(57) ABSTRACT

A method includes forming a fin over a substrate, forming an isolation region adjacent the fin, forming a dummy gate structure over the fin, and recessing the fin adjacent the dummy gate structure to form a first recess using a first etching process. The method also includes performing a plasma clean process on the first recess, the plasma clean process including placing the substrate on a holder disposed in a process chamber, heating the holder to a process temperature between 300° C. and 1000° C., introducing hydrogen gas into a plasma generation chamber connected to the process chamber, igniting a plasma within the plasma generation chamber to form hydrogen radicals, and exposing surfaces of the recess to the hydrogen radicals. The method also includes epitaxially growing a source/drain region in the first recess.

20 Claims, 28 Drawing Sheets

Related U.S. Application Data

(60) Provisional application No. 62/753,739, filed on Oct. 31, 2018.

(51) Int. Cl.
| | |
|---|---|
| *H01L 21/02* | (2006.01) |
| *H01L 21/265* | (2006.01) |
| *H01L 21/266* | (2006.01) |
| *H01L 21/3065* | (2006.01) |
| *H01L 21/67* | (2006.01) |
| *H01L 21/762* | (2006.01) |
| *H01L 29/04* | (2006.01) |
| *H01L 29/08* | (2006.01) |
| *H01L 29/78* | (2006.01) |

(52) U.S. Cl.
CPC .... *H01L 21/3065* (2013.01); *H01L 21/67069* (2013.01); *H01L 21/76224* (2013.01); *H01L 29/045* (2013.01); *H01L 29/0847* (2013.01); *H01L 29/66545* (2013.01); *H01L 29/66636* (2013.01); *H01L 29/7851* (2013.01); *H01J 37/321* (2013.01); *H01J 37/32449* (2013.01); *H01J 2237/334* (2013.01); *H01J 2237/335* (2013.01); *H01L 21/26513* (2013.01); *H01L 21/266* (2013.01); *H01L 29/6656* (2013.01); *H01L 29/6659* (2013.01)

(58) Field of Classification Search
CPC ........... H01J 37/32449; H01J 2237/334; H01J 2237/335
See application file for complete search history.

(56) References Cited

U.S. PATENT DOCUMENTS

| | | | |
|---|---|---|---|
| 2010/0221895 A1 | 9/2010 | Seino et al. | |
| 2012/0306027 A1 | 12/2012 | Kronholz et al. | |
| 2013/0285065 A1 | 10/2013 | Zhu et al. | |
| 2013/0298835 A1* | 11/2013 | Tam | B05B 1/18 118/728 |
| 2014/0099794 A1* | 4/2014 | Ingle | H01L 21/67069 156/345.35 |
| 2014/0167164 A1 | 6/2014 | Adam et al. | |
| 2015/0011056 A1 | 1/2015 | Kapoor et al. | |
| 2015/0140756 A1 | 5/2015 | Yu et al. | |
| 2015/0255528 A1 | 9/2015 | Dunn et al. | |
| 2015/0255601 A1 | 9/2015 | Huang et al. | |
| 2016/0020301 A1 | 1/2016 | Park et al. | |
| 2016/0049496 A1 | 2/2016 | Lu et al. | |
| 2016/0079062 A1 | 3/2016 | Zheng et al. | |
| 2016/0087104 A1 | 3/2016 | Lee et al. | |
| 2016/0148821 A1 | 5/2016 | Singh et al. | |
| 2016/0284837 A1 | 9/2016 | Kim et al. | |
| 2016/0296981 A1* | 10/2016 | Baluja | B08B 7/0021 |
| 2017/0110327 A1 | 4/2017 | Kim et al. | |
| 2017/0207069 A1* | 7/2017 | Bhatia | C23C 16/4411 |
| 2017/0229289 A1* | 8/2017 | Lubomirsky | H01L 21/32136 |
| 2017/0323768 A1* | 11/2017 | Zhang | H01J 37/32082 |
| 2017/0352726 A1 | 12/2017 | Zhou et al. | |
| 2018/0061615 A1* | 3/2018 | Kim | H01L 21/6704 |
| 2018/0082836 A1 | 3/2018 | Yan et al. | |
| 2018/0083109 A1 | 3/2018 | Yu et al. | |
| 2019/0035646 A1* | 1/2019 | Nasman | H01L 21/68735 |
| 2019/0122902 A1* | 4/2019 | Ko | H01L 21/31116 |
| 2019/0136373 A1* | 5/2019 | Yeh | H01J 37/32862 |
| 2019/0203350 A1 | 7/2019 | Khaja et al. | |

FOREIGN PATENT DOCUMENTS

| | | |
|---|---|---|
| KR | 20160035650 A | 4/2016 |
| KR | 20170043900 A | 4/2017 |

\* cited by examiner

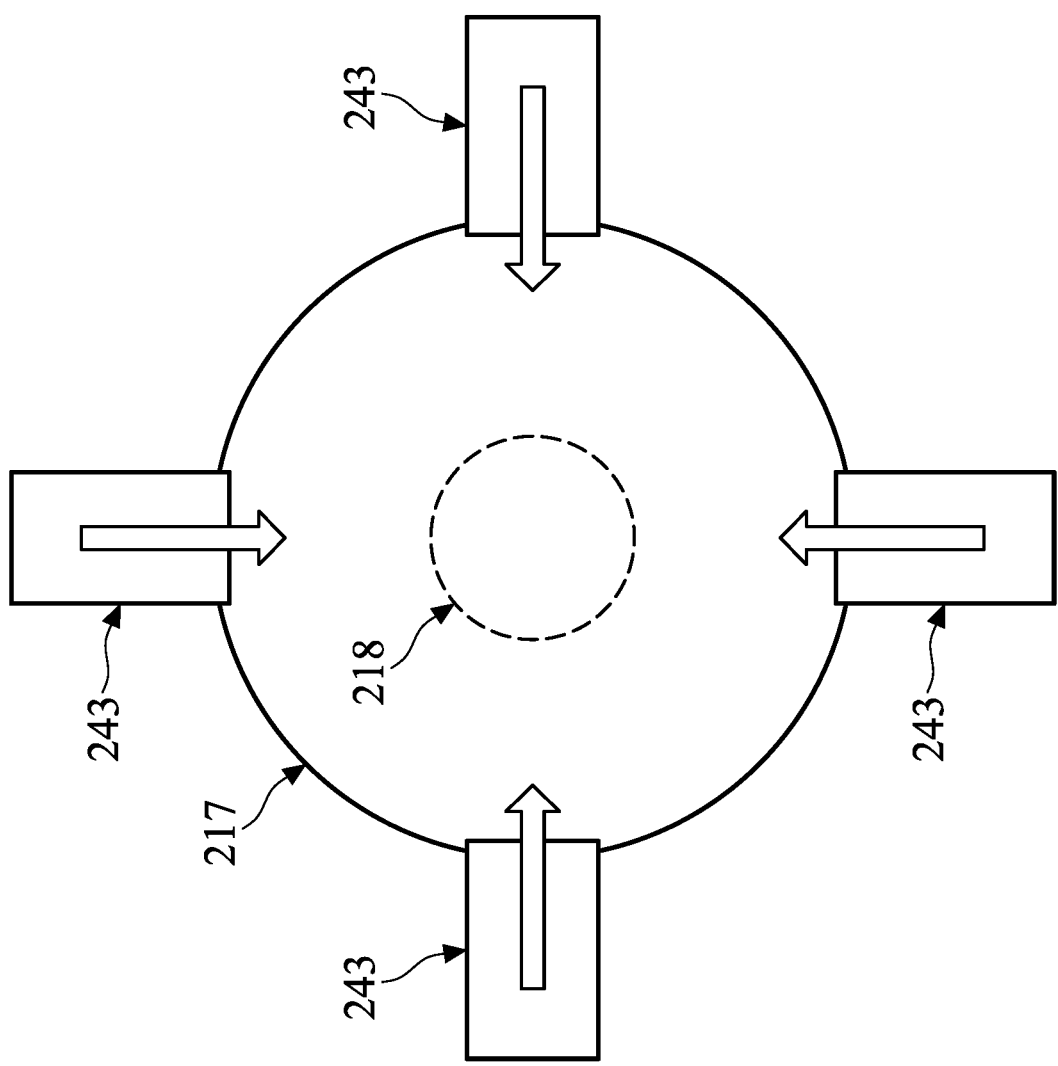

FINFET DEVICE AND METHOD OF FORMING SAME

PRIORITY CLAIM AND CROSS-REFERENCE

This application is a divisional application and claims the benefit of U.S. patent application Ser. No. 16/458,571, entitled "FINFET Device and Method of Forming Same," filed Jul. 1, 2019, which claims the benefit of U.S. Provisional Patent Application No. 62/753,739, filed Oct. 31, 2018, which applications are hereby incorporated by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-G and FIG. 14 are schematic diagrams of a system for performing a plasma cleaning process, in accordance with some embodiments.

DETAILED DESCRIPTION

Figure 1:
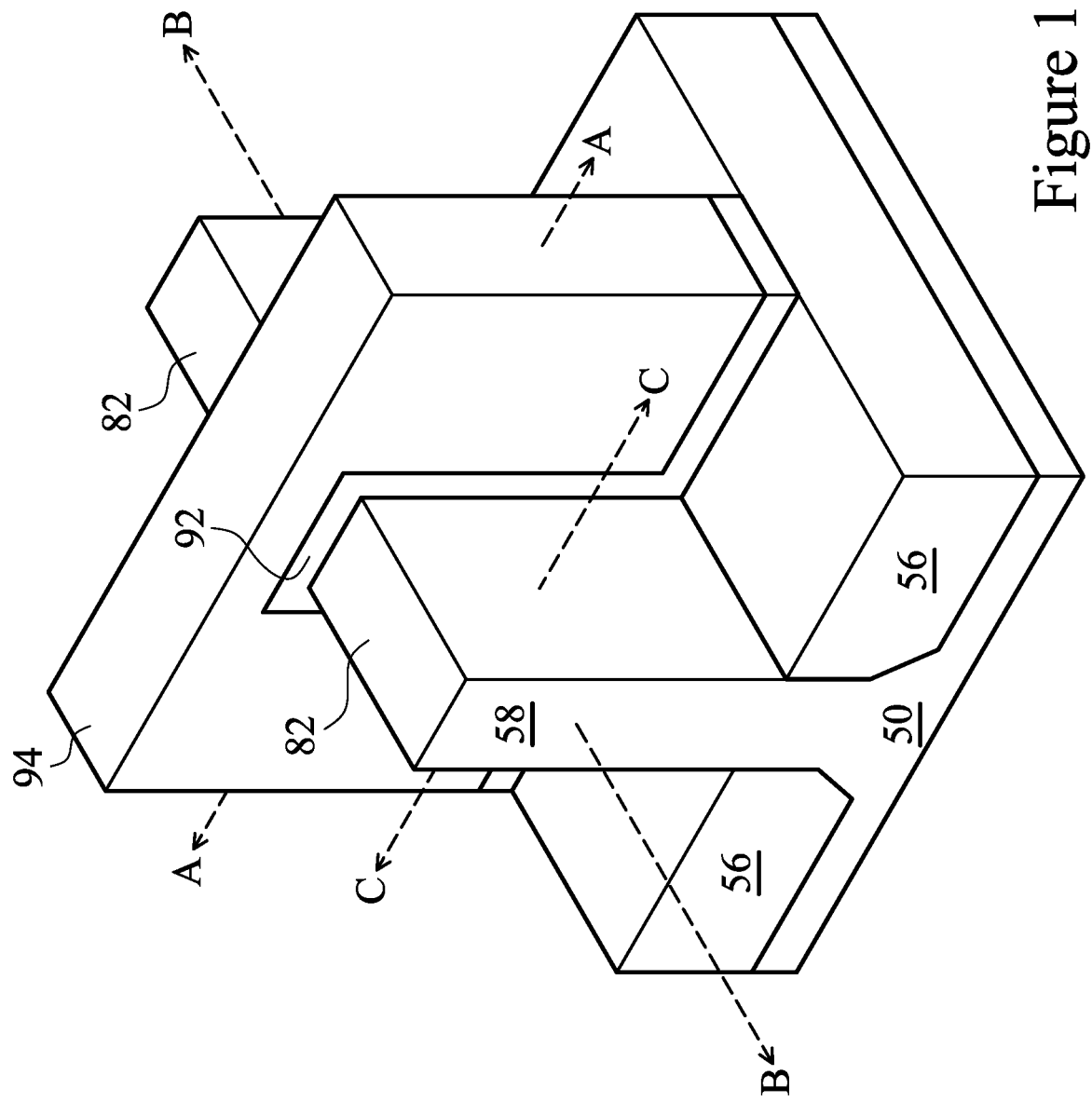
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for forming recesses in the source/drain region of a FinFET device. The embodiments herein include a plasma cleaning process that removes contamination present on the recess surfaces prior to formation of the epitaxial source/drain regions. The plasma cleaning process can also reshape the recesses. For example, the plasma cleaning process can reshape the recesses such that the bottoms of the epitaxial source/drain regions have a pointed shape defined by crystalline planes. By controlling the shape of the epitaxial source/drain region of a FinFET in this manner, the performance of the FinFET device may be improved. Various embodiments presented herein are discussed in the context of FinFETs formed using a gate-last process. In other embodiments, a gate-first process may be used. Some embodiments contemplate aspects used in planar devices, such as planar FETs. Some embodiments may also be used in semiconductor devices other than FETs.

FIG. 1 illustrates an example of a FinFET in a three-dimensional view, in accordance with some embodiments. The FinFET includes a fin 58 on a substrate 50 (e.g., a semiconductor substrate). Isolation regions 56 are disposed in the substrate 50, and the fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed in opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, for example perpendicular to the direction of current flow between the source/drain regions 82 of the FinFET. Cross-section B-B is perpendicular to cross-section A-A and is along a longitudinal axis of the fin 58 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 10:
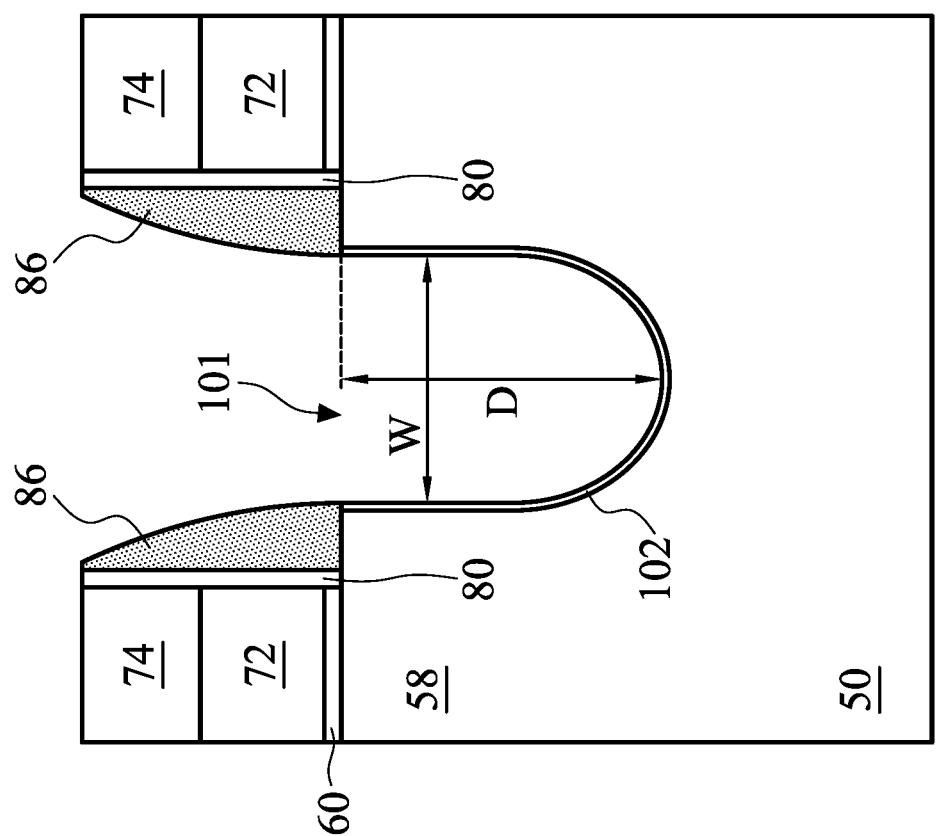
FIGS. 10-12 are cross-sectional views of intermediate stages of forming recesses for epitaxial source/drain regions in the manufacturing of FinFETs, in accordance with some embodiments.
Figure 11:
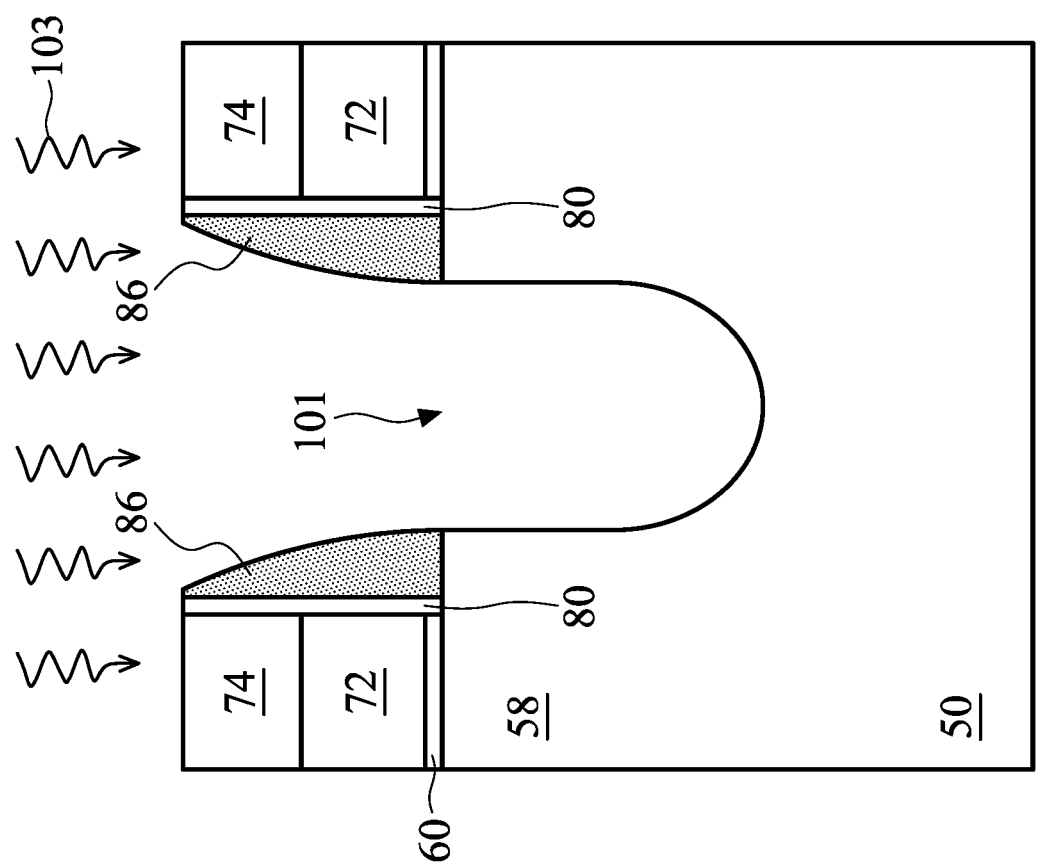
Figure 12:
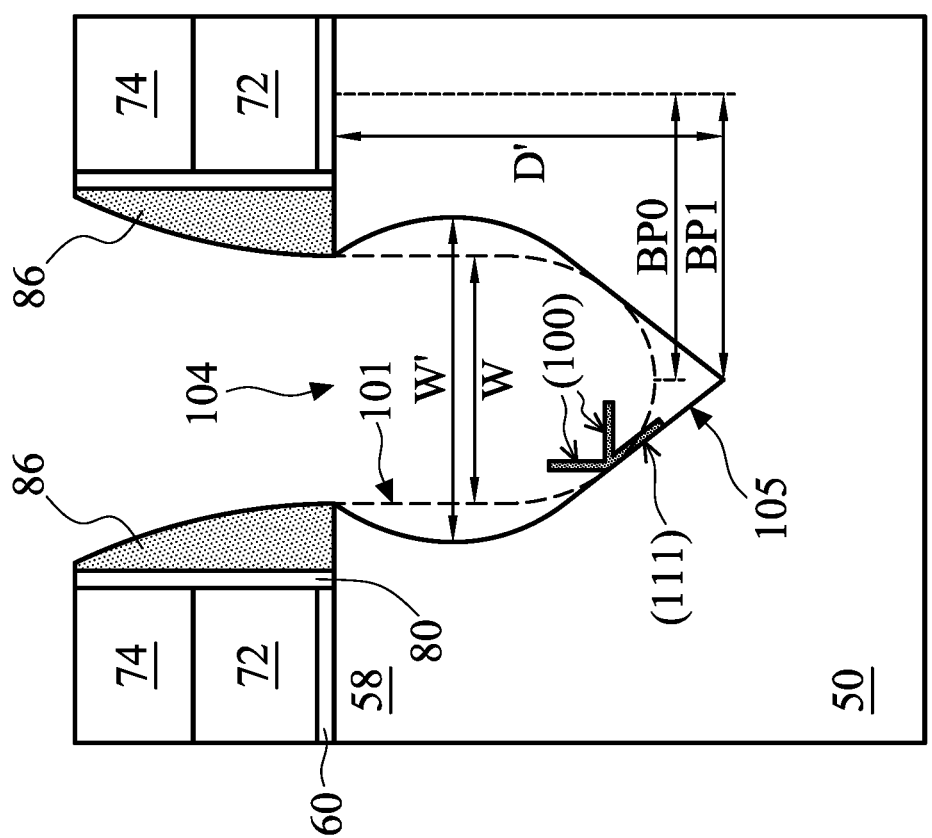

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. In FIGS. 8A-B, 9A-B, and 15A through 21B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 10-12 are illustrated along reference cross-section A-A illustrated in FIG. 1. FIGS. 15C and 15D are illustrated along reference cross-section C-C illustrated in FIG. 1, except for multiple fins/FinFETs.

Figure 2:
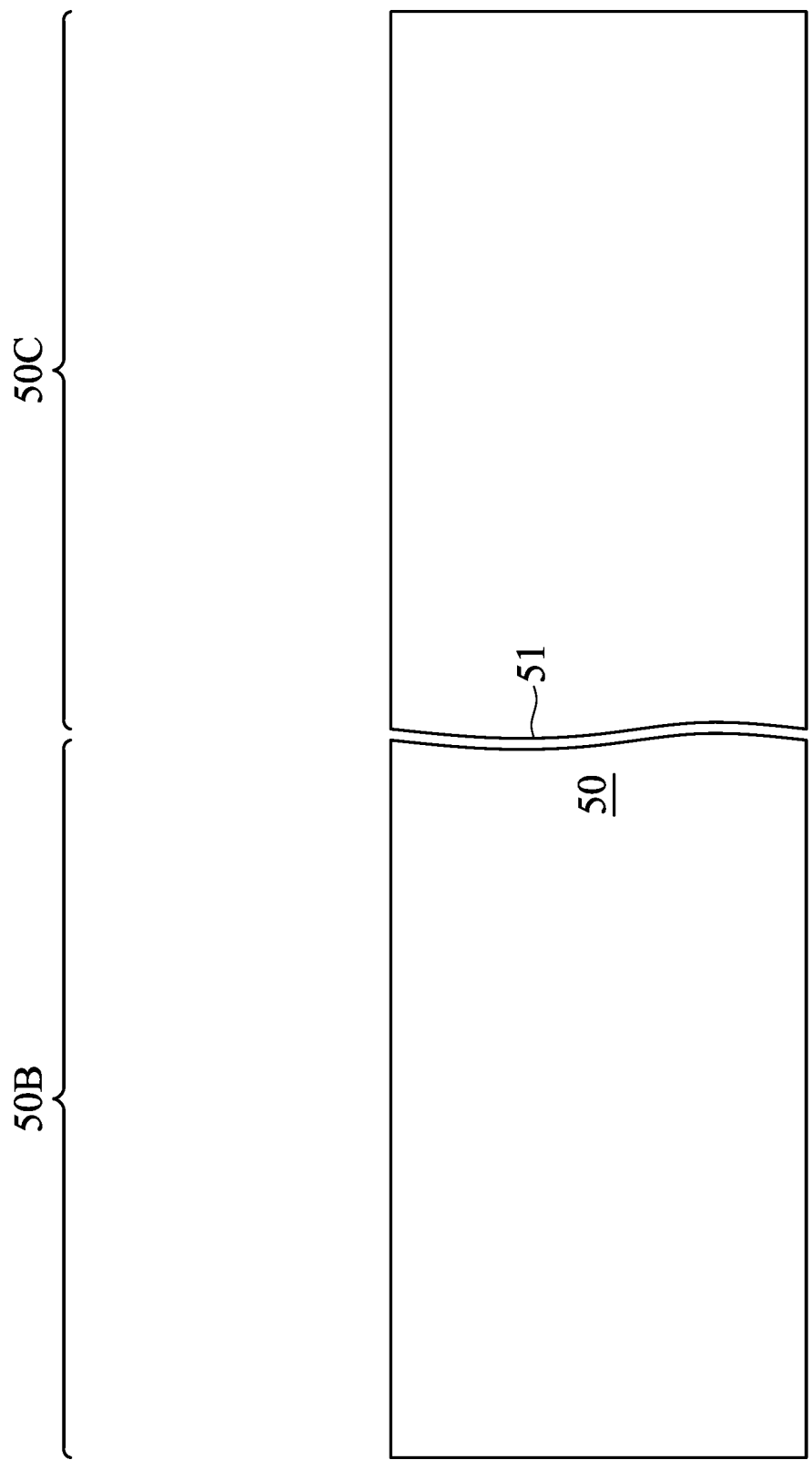
FIGS. 2, 3, 4, 5, 6, 7, 8A, 8B, 9A, and 9B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate 50 is a silicon wafer having a (100) crystalline orientation. In other embodiments, the substrate 50 is a silicon wafer having another crystalline orientation, such as (110) or (111).

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
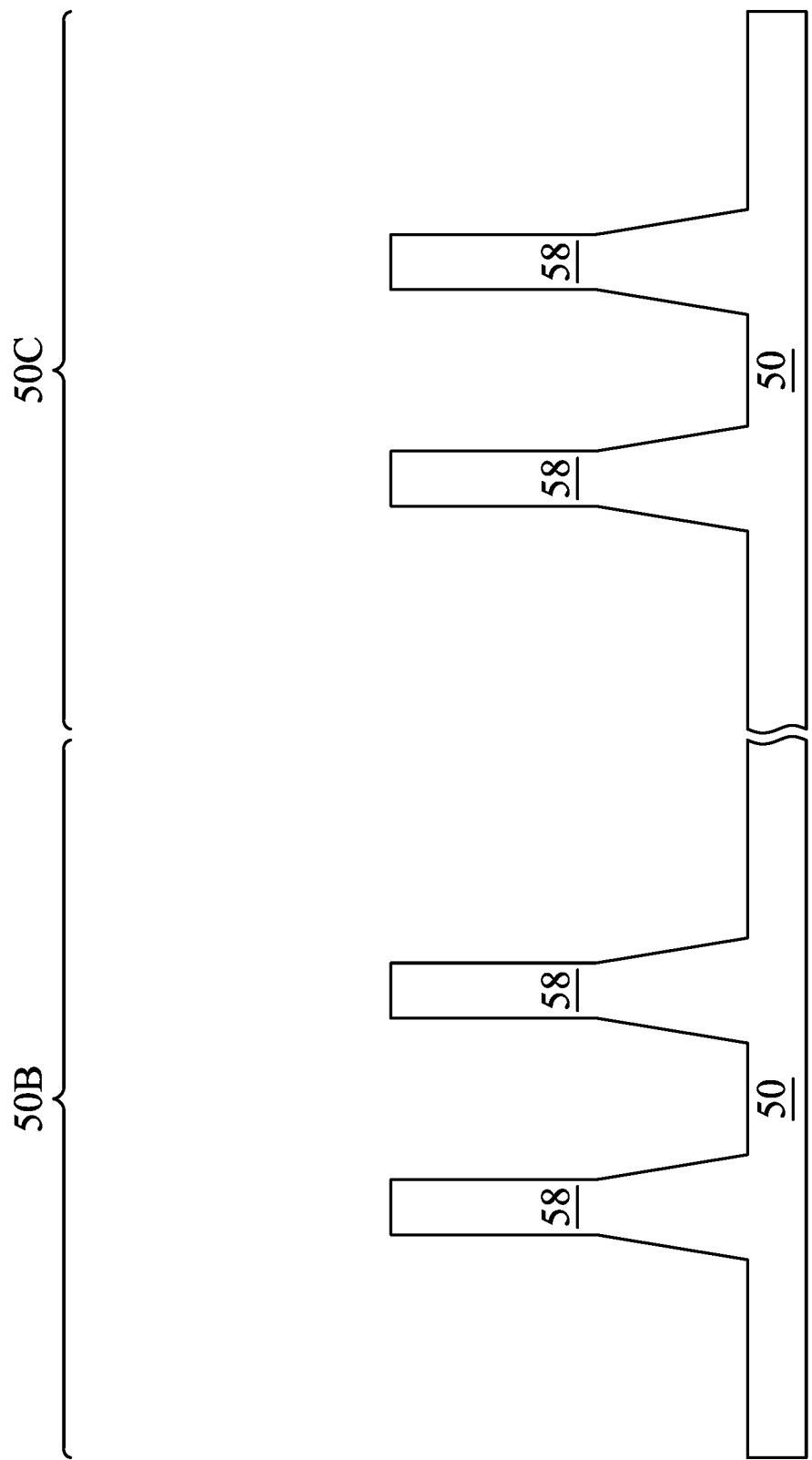

In FIG. 3, fins 58 are formed in the substrate 50. The fins 58 may be, for example, semiconductor strips. In some embodiments, the fins 58 may be formed in the substrate 50 by etching trenches in the substrate 50. The etching may be any acceptable etch process, such as a reactive ion etch (RIE), neutral beam etch (NBE), the like, or a combination thereof. The etch process may be anisotropic.

The fins 58 may be patterned by any suitable method. For example, the fins 58 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 58.

Figure 4:
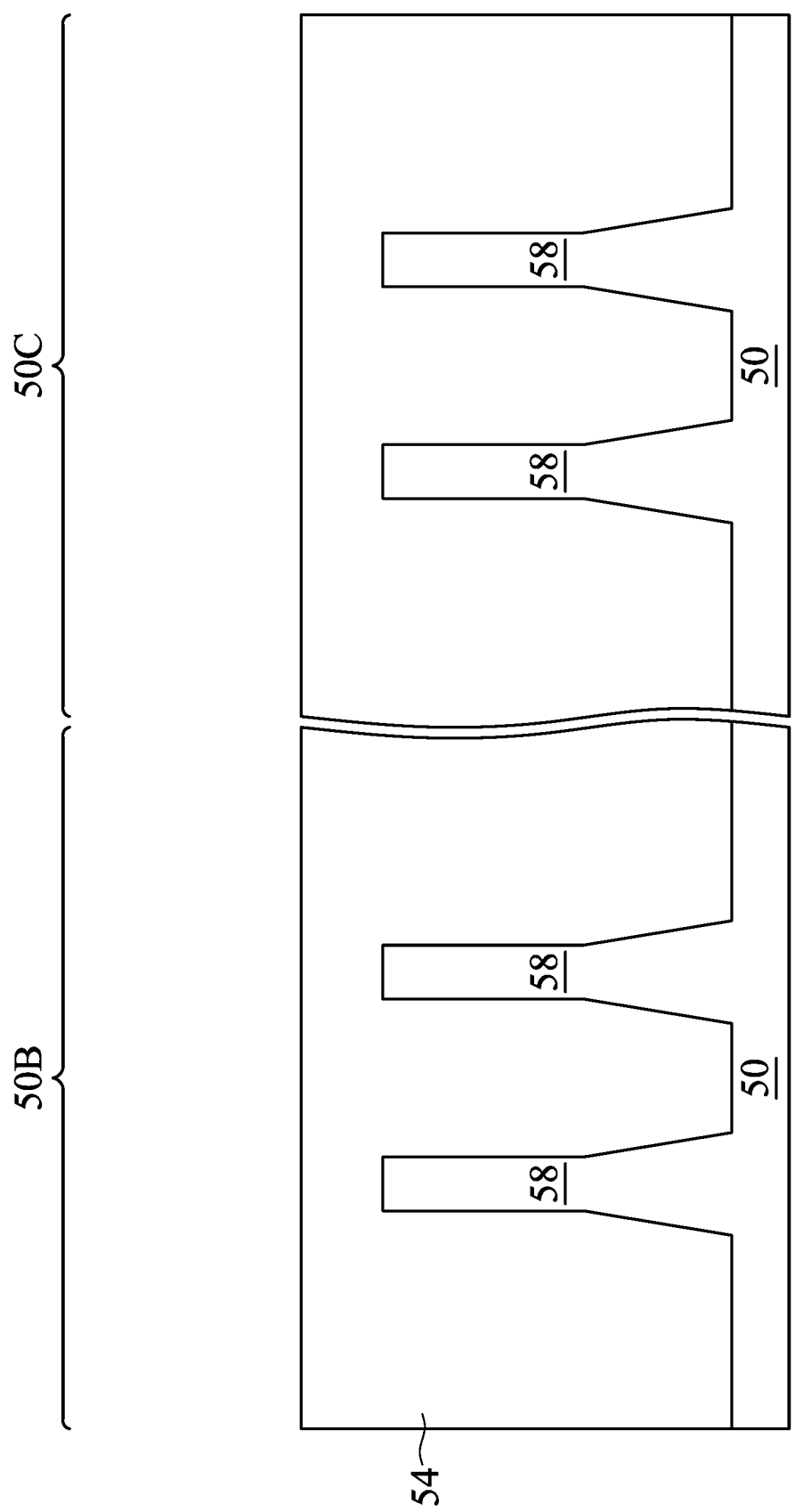

In FIG. 4, an insulation material 54 is formed over the substrate 50 and between neighboring fins 58. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 58.

Figure 5:
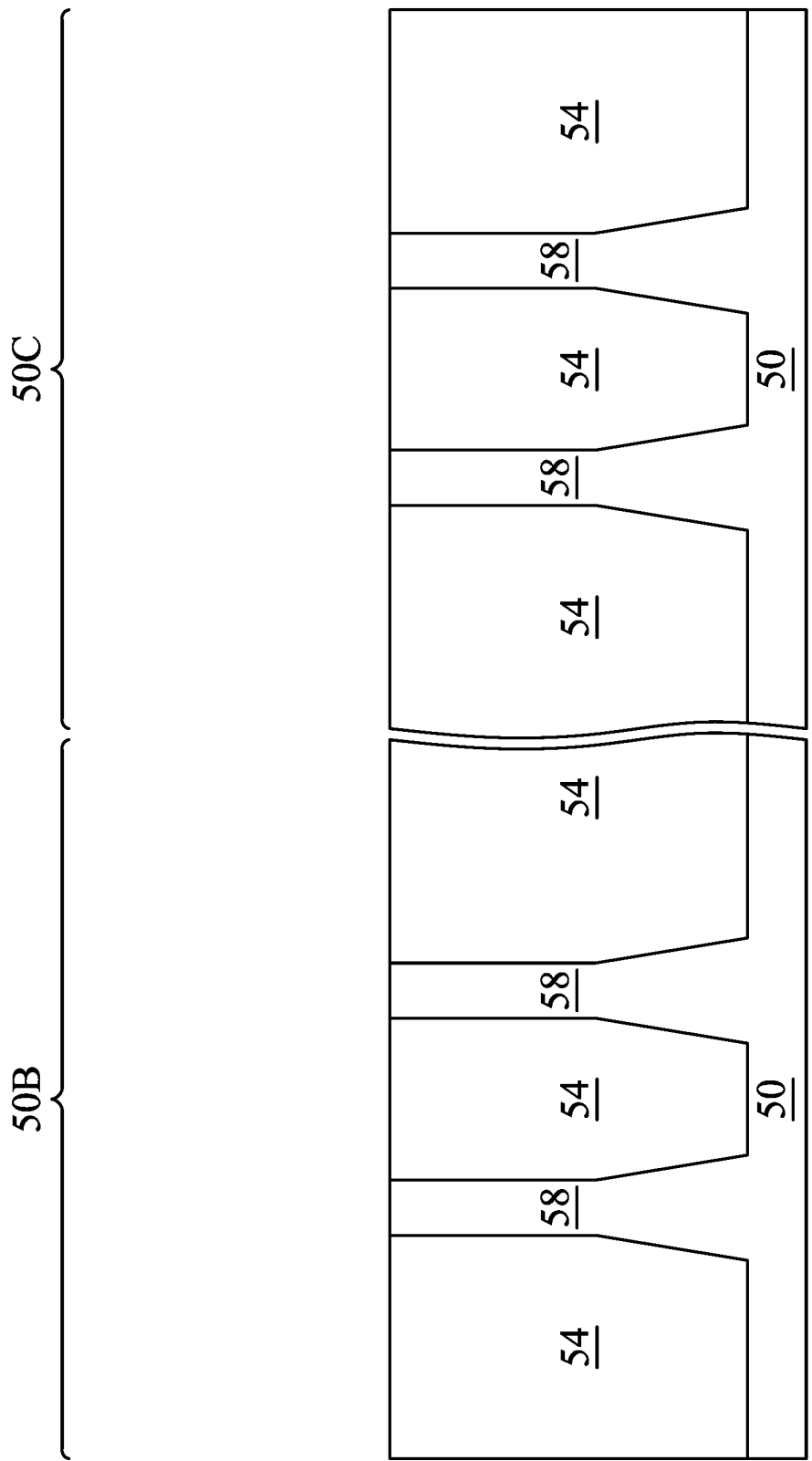

In FIG. 5, a planarization process is applied to the insulation material 54. In some embodiments, the planarization process includes a chemical mechanical polish (CMP), an etch-back process, combinations thereof, or the like. The planarization process exposes the fins 58. Top surfaces of the fins 58 and the insulation material 54 are level after the planarization process is complete.

Figure 6:
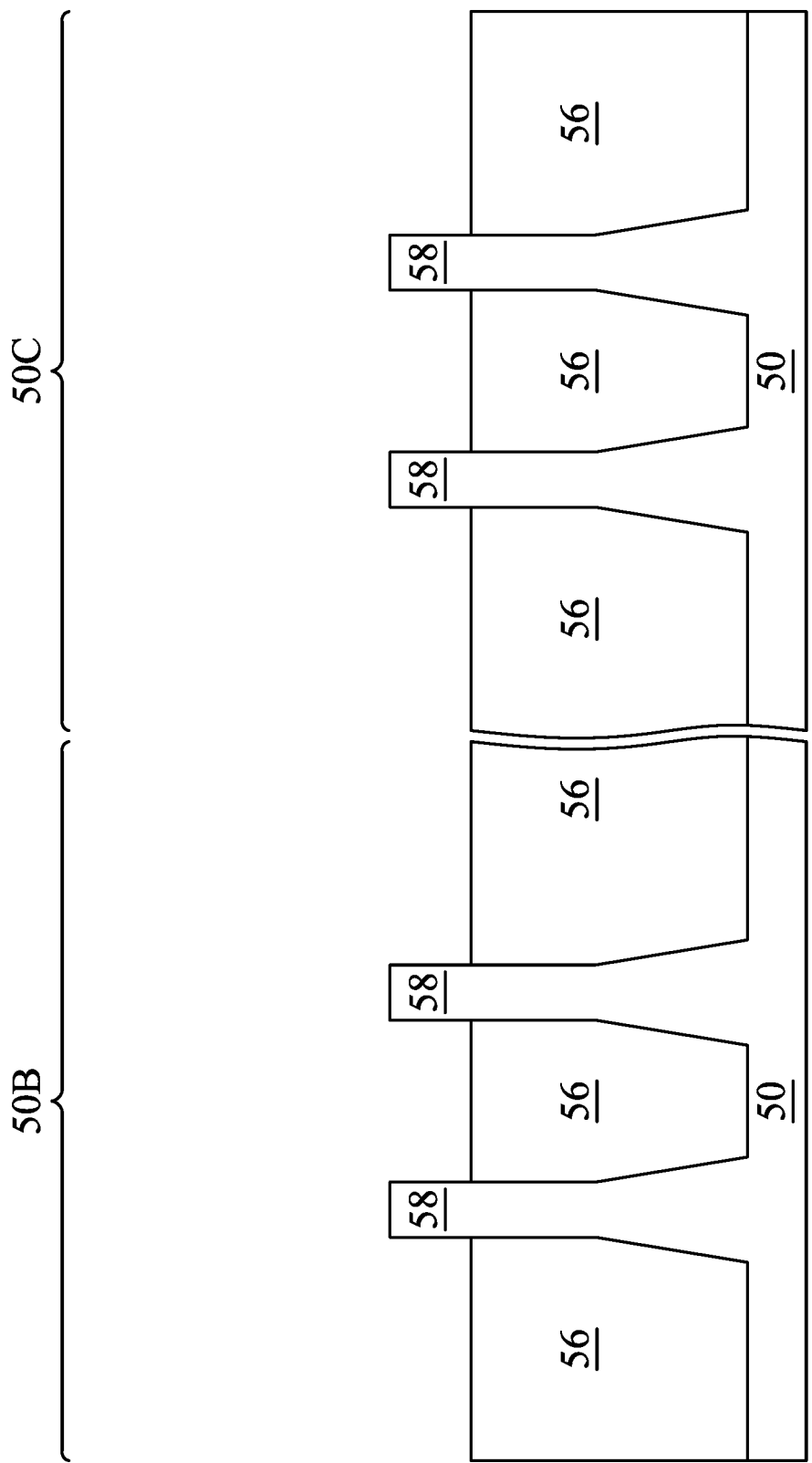

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54.

The process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 58. For example, the fins 58 in FIG. 5 can be recessed, and a material different from the fins 58 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, the fins 58, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, $BF_2$, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
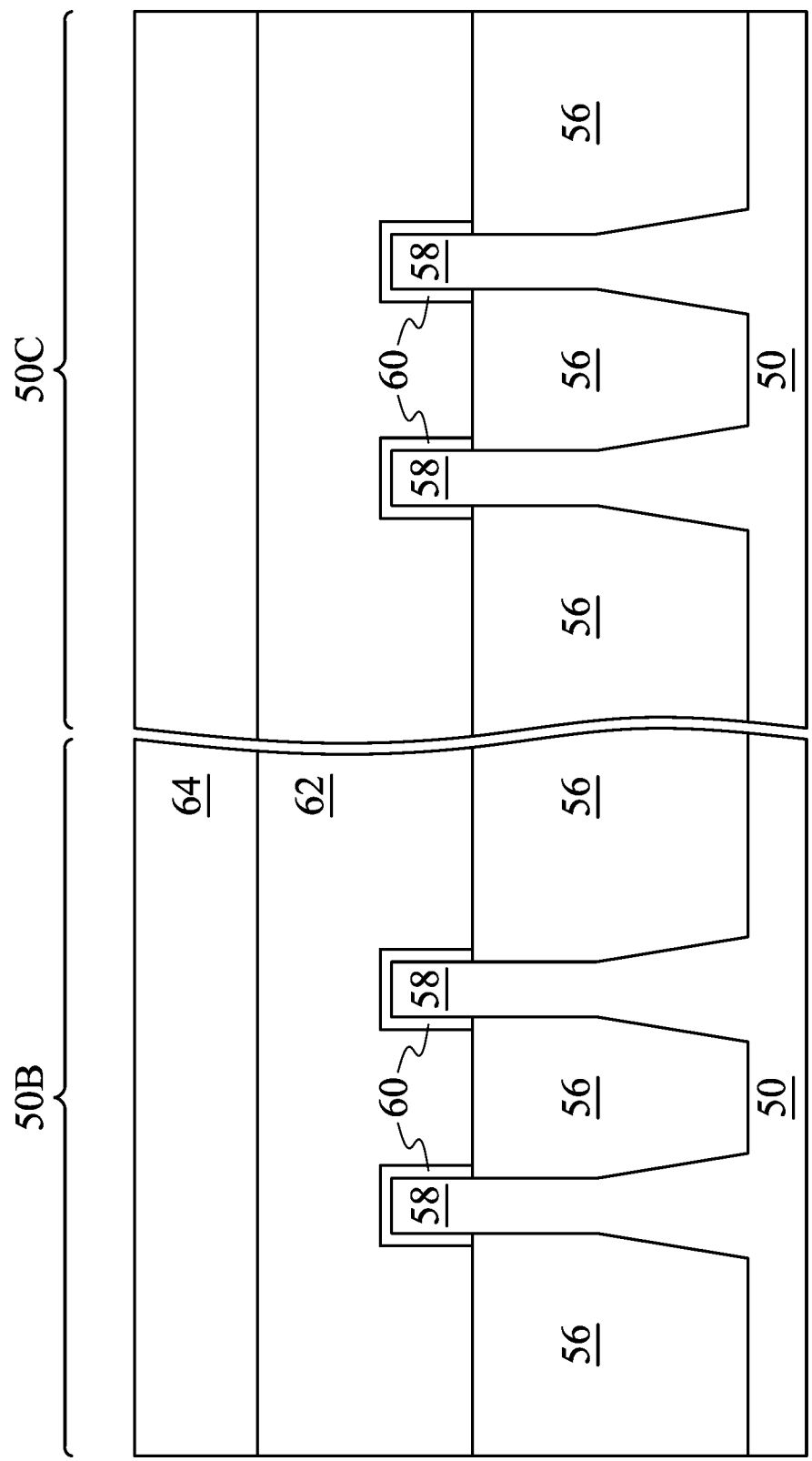

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 8A through 21B illustrate various additional steps in the manufacturing of embodiment devices. FIGS. 8A through 21B illustrate features in either of the region 50B and the region 50C. For example, the structures illustrated in FIGS. 8A through 21B may be applicable to both the region 50B and the region 50C. Differences (if any) in the structures of the region 50B and the region 50C are described in the text accompanying each figure.

Figure 8B:
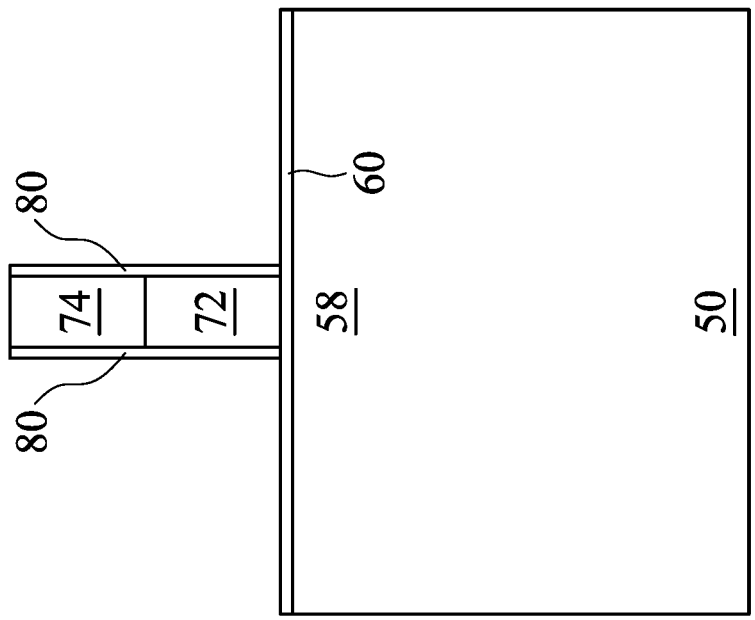
Figure 8A:
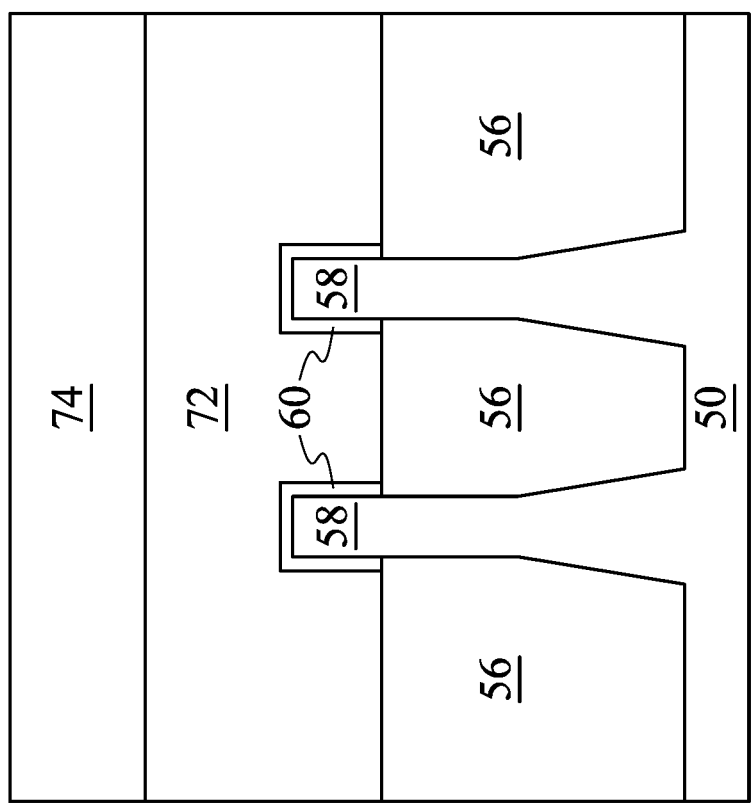

In FIGS. 8A-B, the mask layer 64 (see FIG. 7) may be patterned using acceptable photolithography and etching techniques to form masks 74. The pattern of the masks 74 then may be transferred to the dummy gate layer 62 (see FIG. 7) and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 58. Further in FIGS. 8A-B, gate seal spacers 80 can be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 9B:
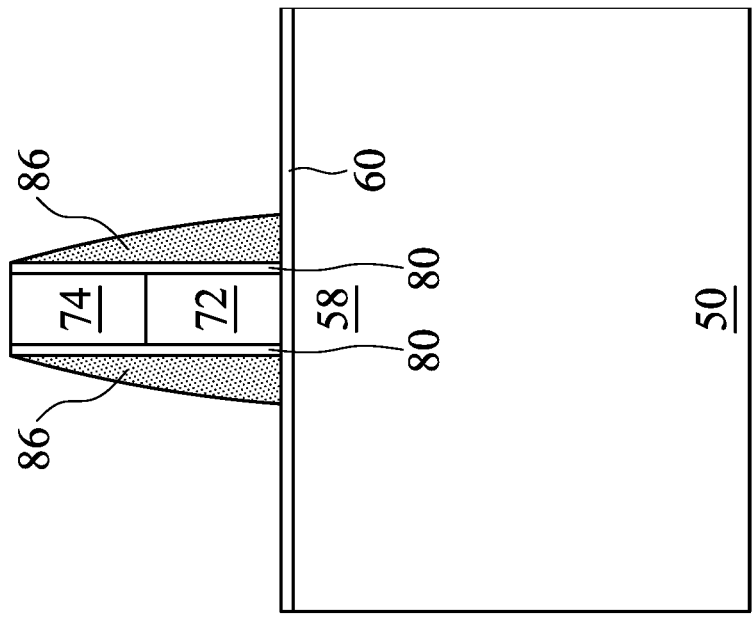
Figure 9A:
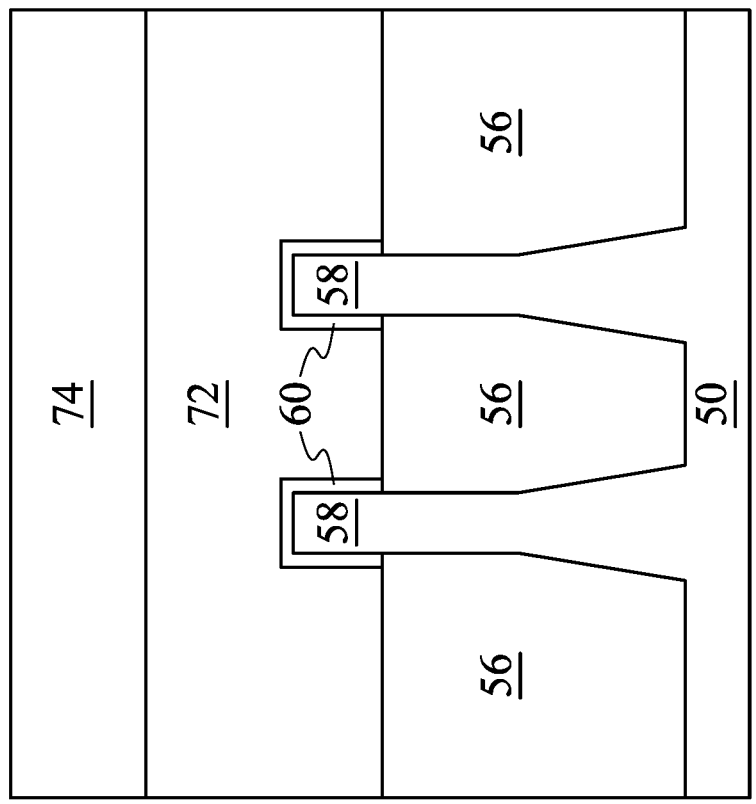

In FIGS. 9A-B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be SiN, SiCN, a combination thereof, or the like.

FIGS. 10-12 show the formation of recesses 101 in the fins 58. Epitaxial source/drain regions 82 (see FIGS. 15A-B) are subsequently formed in the recesses 101 of the fins 58, described in greater detail below. During the formation of the recesses 101 in one region (e.g., region 50B or 50C), the other region may be masked by a mask (not shown). As such, recesses 101 for n-type devices (e.g., in region 50B) and/or recesses 101 for p-type devices (e.g., in region 50C) may be formed using the techniques described with respect to FIGS. 10-12. Referring first to FIG. 10, a patterning process is performed on the fins 58 to form the recesses 101 in source/drain regions of the fins 58. The patterning process may be performed in a manner that the recesses 101 are formed between neighboring dummy gate stacks 72 (in interior regions of the fins 58), or between an isolation region 56 and adjacent dummy gate stacks 72 (in end regions of the fins 58). In some embodiments, the recesses 101 may be formed having a lateral width W between about 1 nm and about 3 nm, such as about 2 nm. In some embodiments, the recesses 101 may be formed having a depth D as measured from a top surface of the fins 58 that is between about 1 nm and about 5 nm, such as about 3 nm.

In some embodiments, the patterning process may include a suitable anisotropic dry etching process, while using the dummy gate stacks 72, the gate spacers 84, and/or isolation regions 54 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, the like, or a combination thereof. In some embodiments, the anisotropic etching process is performed in a processing chamber, and process gases may be flowed into the processing chamber at a rate between about 100 sccm and about 3000 sccm. Carrier gases may be flowed into the processing chamber at a rate between about 100 sccm and about 5000 sccm. In some embodiments, the anisotropic etching process is performed at a temperature between about 100° C. and about 1000° C. In some embodiments, a pressure in the processing chamber may be between about 0.1 Torr and about 5 Torr. In some embodiments, the patterning process forms recesses 101 having U-shaped bottom surfaces. The recesses 101 may also be referred to as U-shaped recesses 101, an example recess 101 of which is shown in FIG. 10.

Still referring to FIG. 10, in some cases, etching residue 102 may be present on some surfaces of the recesses 101 after the recesses 101 have been etched. The etching residue 102 may, for example, include reaction byproducts present during the etching. The etching residue 102 may include oxides, carbon residue, fluorocarbons (e.g., $C_xF_y$ polymers), hydrocarbons, materials such as $C_xCl_y$ or $C_xF_yCl_z$, or other types of residue. In some cases, the etching residue 102 may include a thermal oxide or a native oxide (e.g., silicon oxide) that forms on surfaces of the recesses 101 during etching or after the etching. In some cases, the presence of etching residue 102 within recesses 101 can degrade device performance. For example, remaining etching residue 102 can increase electrical resistance in a device or increase the amount of defects generated within the subsequently formed epitaxial source/drain regions 82.

Turning to FIG. 11, a plasma cleaning process 103 is performed to remove some of or all of the etching residue 102 from the recesses 101. The plasma cleaning process 103 may also be referred to as the plasma clean 103. The plasma clean 103 removes etching residue 102 by exposing the etching residue 102 to hydrogen radicals (H*). The H radicals may be formed, for example, by flowing $H_2$ gas into a plasma generation chamber and igniting a plasma within the plasma generation chamber. In some embodiments, an additional gas may be ignited into a plasma within the plasma generation chamber, such as Ar. In some embodiments, the substrate 50 may be placed in processing chamber and the plasma generation chamber may be in a separate chamber connected to the processing chamber. In this manner, the plasma that is generated may be a remote plasma. An example system that may be used to perform the plasma clean 103 is described below in FIGS. 13-14.

In some embodiments, carrier gases, such as $N_2$, Ar, He, Xe, or the like, may be used to carry process gases such as $H_2$ and other process gases into the plasma generation chamber. The carrier gases may also be used to carry H radicals from the plasma generation chamber into the processing chamber. In some embodiments, one or more carrier gases are ignited into a plasma within the plasma generation chamber during the plasma clean 103. In some embodiments, process gases may be flowed into the processing chamber at a rate between about 100 sccm and about 3000 sccm. For example, $H_2$ gas may be flowed into the plasma generation chamber at a rate between about 100 sccm and about 3000 sccm. Carrier gases may be flowed into the processing chamber or into the plasma generation chamber at a rate between about 100 sccm and about 5000 sccm. In some embodiments, the plasma clean 103 is performed at a temperature between about 100° C. and about 1000° C. In some cases, the use of a temperature between about 100° C. and about 1000° C. can reduce the amount of silicon etched during the plasma clean 103, with higher temperatures having a lower silicon etch rate than lower temperatures. In some cases, H radicals are more reactive at temperatures greater than 300° C., and thus H radicals are more efficient at reacting with carbon to form volatile products at higher temperatures. In this manner, the use of a higher temperature plasma clean 103 with H radicals can improve carbon removal efficiency. In some embodiments, a pressure in the processing chamber may be between about 0.1 Torr and about 4 Torr. In some cases, the use of a pressure between about 0.1 Torr and about 4 Torr can reduce the amount of silicon etched during the plasma clean 103. In some cases, H radicals are more likely to collide with and react with carbon at higher processing chamber pressures. In this manner, the use of a higher pressure plasma clean 103 with H radicals can improve carbon removal efficiency. In some embodiments, the plasma clean 103 is performed for a time between about 5 seconds and about 1000 seconds. In some embodiments, the plasma clean 103 includes multiple steps.

In some cases, the use of H radicals to remove etching residue 102 as part of the plasma clean 103 can allow for more thorough removal of etching residue 102 with less etching of the material of the fins 58. In some embodiments, performing the plasma clean 103 at a relatively high process temperature, such as greater than about 300° C., can reduce the recombination of H radicals and thus allow more of the etching residue 102 to be exposed for reaction with H radicals during the plasma clean 103. In this manner, the plasma clean 103 as described herein can allow more carbon or more oxygen within the etching residue 102 to be removed. In some cases, the use of a higher process temperature as described herein (e.g., greater than about 300° C.) during the plasma clean 103 can allow for about 90% more of the carbon to be removed from the etching residue 102, compared with the use of lower process temperatures (e.g., less than about 300° C.) or with wet chemical cleaning processes. In some cases, the plasma clean 103 removes between about 70% and about 90% of the etching residue 102. In some embodiments, about 10% or less of the carbon remains in the etching residue 102 after the plasma clean 103 is performed. In some cases, a higher process temperature reduces the rate at which H radicals etch silicon, and thus the use of a higher process temperature during the plasma clean 103 can provide a more thorough removal of the etching residue 102 while also reducing the amount of fin 58 material that is etched during the plasma clean 103. In some embodiments, the plasma clean 103 has a silicon etch rate of less than about 0.5 Å/min, such as about 0.1 Å/min.

In some cases, the parameters of the plasma clean 103 can be controlled to etch portions of the recesses 101. FIG. 12 shows a reshaped recess 104 formed by further etching a recess 101 using the plasma clean 103, according to some embodiments. In addition to reshaped recess 104, FIG. 12 shows an outline of the original recess 101 prior to the plasma clean 103. In some cases, the plasma clean 103 can laterally and vertically etch into the sidewalls of the recess 101, forming a reshaped recess 104 that is wider than the recess 101 and that is deeper than the recess 101. For example, the reshaped recess 104 may have a width W' that is greater than a width W of the original recess 101. In some cases, sidewall portions of the reshaped recess 104 may have curved or convex surfaces, as shown in FIG. 12. In some embodiments, the reshaped recesses 104 is formed having a lateral width W' greater than the lateral width W by between about 0 nm and about 3 nm. In some embodiments, the reshaped recesses 104 is formed having a depth D' as measured from a top surface of the fins 58 greater than the depth D between about 0 nm and about 5 nm.

In some cases, the H radicals of the plasma clean 103 may preferentially etch some crystalline planes of the semiconductor material of the fins 58. As an example, for embodiments in which the material of the fins 58 is silicon, the H radicals may selectively etch (100) planes over (111) planes or (110) planes. Examples of (100) planes and a (111) plane are indicated in FIG. 12, though (100), (111), or (110) planes other than those indicated may also be present. In some cases, the etch rate of (100) planes may be about three times greater than the etch rate of (111) planes. Due to this selectivity, the etching by the H radicals may tend to slow or stop along (111) planes or (110) planes of silicon during the second patterning process.

In some embodiments, the selective etching by the H radicals of the plasma clean 103 may cause some sidewalls of the reshaped recess 104 to have surfaces that are (111) planes or (110) planes. This is shown in FIG. 12, in which some or all of the lower sidewalls 105 of the recess 126 have surfaces along crystalline planes. The lower sidewalls 105 may have surfaces that include (111) planes, (110) planes, or a combination of (111) planes or (110) planes. In some cases, a proportion of (111) planes to (110) planes present in the lower sidewalls 105 may depend on the crystalline orientation of the material of the fins 56 or of the substrate 50.

In some cases, the lower sidewalls 105 having surfaces along crystalline planes may result in the bottom of the reshaped recess 104 having a tapered shape, pointed shape, or a V-shape as shown in FIG. 12. For example, a bottom of the reshaped recess 104 having a V-shape may be formed in silicon having a (100) crystalline orientation. In some cases, at the bottom of the reshaped recess 104, opposite lower sidewalls 105 may have surfaces along crystalline planes that meet at an angle defined by the intersection of the crystalline planes of the surfaces. For example, in some cases the bottom of the reshaped recess 126 may be defined by the intersection of a crystalline plane of a first sidewall surface and a crystalline plane of a second sidewall surface. In some cases, reshaped recesses 104 formed in silicon having (111) or (110) crystalline orientations may have a shape similar to that shown in FIG. 12, or may have another shape due to (111) or (110) silicon having differently oriented crystalline planes than (100) silicon. In some cases, the plasma clean 103 may preferentially etch the channel region of the FinFET along (110) planes. In some cases, an angle between a (111) plane of a lower sidewall 105 of a reshaped recess 104 and a (100) plane of silicon may be between about 30 degrees and about 90 degrees, such as about 70 degrees. In some embodiments, the parameters of the plasma clean 103 may be controlled to create a desired angle of a lower sidewall 105 of a reshaped recess 104. The plasma clean 103 may be used to form recesses for n-type FinFETs or for p-type FinFETS that are similar to the reshaped recess 104 described herein.

In some cases, by having the bottom of the reshaped recess 104 be defined by the intersection of crystalline planes as described, the bottom proximity BP1 of the reshaped recess 104 may be greater than the bottom proximity BP0 of the original recess 101. For example, a reshaped recess 104 having a V-shaped bottom may be farther from neighboring fins than a recess 101 having a U-shaped bottom or a more horizontal bottom surface, such as the recess 101 shown in FIG. 12. In some cases, a larger bottom proximity reduces the amount of dopants within the epitaxial source/drain regions that diffuse into or under the channel of a FinFET. The reduction of diffused dopants can improve device performance. For example, reducing the diffusion of dopants can reduce unwanted Drain-Induced Barrier Lowering (DIBL) effects or can decrease off-state leakage of a FinFET device. Additionally, increasing the width W of the recess 101 to the width W' by using the plasma clean 103 can reduce the size of the channel region of the FinFET, which can increase the on-state current ($I_{ON}$). In some cases, the use of the plasma clean 103 can increase the on-state DC current of a FinFET device by about 5%.

FIGS. 13A-G and FIG. 14 illustrate an etching system 200 that may be used to perform the plasma clean 103, in accordance with some embodiments. The etching system 200 shown in FIG. 13A includes a plasma generation chamber 230 connected to a process chamber 203. In an embodiment, the etching system 200 receives first process gases (e.g., $H_2$) from a first delivery system 205 and/or second process gases from a second delivery system 206. In an embodiment, the first precursor system 205 and the second precursor system 206 may work in conjunction with one another to supply the various different process gases to the process chamber 203 wherein the semiconductor device 201 (e.g., substrate 50) is placed. The first delivery system 205 and the second delivery system 206 may have physical components that are similar with each other. In other embodiments, fewer or more delivery systems may be used.

For example, the first delivery system 205 and the second delivery system 206 may each include a gas supply 207 and a flow controller 209. The gas supply 207 may be a vessel, such as a gas storage tank, that is located either locally to the process chamber 203 or else may be located remotely from the process chamber 203. Alternatively, the gas supply 207 may be a facility that independently prepares and delivers the first process gases to the flow controller 209. Any suitable source for the first process gases may be utilized as the gas supply 207, and all such sources are fully intended to be included within the scope of the embodiments.

The gas supply 207 may supply the desired process gases to the flow controller 209. The flow controller 209 may be used to control the flow of the process gases to the gas controller 213 and, eventually, to the plasma generation chamber 230, thereby also helping to control the pressure within the plasma generation chamber 230. The flow controller 209 may be, e.g., a proportional valve, a modulating valve, a needle valve, a pressure regulator, a mass flow controller, combinations of these, or the like. However, any suitable method for controlling and regulating the flow of the process gases may be used, and all such components and methods are fully intended to be included within the scope of the embodiments.

However, while the first delivery system 205 and the second delivery system 206 have been described herein as having identical components, this is merely an illustrative example and is not intended to limit the embodiments in any fashion. Any type of suitable process gas delivery system, with any type and number of individual components identical to or different from any of the other delivery systems within the etching system 200, may alternatively be utilized. All such delivery systems are fully intended to be included within the scope of the embodiments.

The first delivery system 205 and the second delivery system 206 may supply their individual process gases into a gas controller 213. The gas controller 213 connects and isolates the first delivery system 205 and the second delivery system 206 from the plasma generation chamber 230 in order to deliver the desired process gases to the plasma generation chamber 230. The gas controller 213 may include such devices as valves, flow meters, sensors, and the like to control the delivery rates of each of the process gases, and may be controlled by instructions received from the control unit 215 (described further below with respect to FIG. 14). In some embodiments, a carrier gas delivery system 214 may be connected to the gas controller 213 and provide a carrier gas to the plasma generation chamber 230. The carrier gas delivery system 214 may include a gaseous tank or other facility that provides a carrier gas such as nitrogen ($N_2$), helium (He), argon (Ar), xenon (Xe), or combinations of these, or the like, although other suitable carrier gases may alternatively be used. In some embodiments, the gas supply 207 may supply carrier gases in addition to or instead of process gases.

The gas controller 213, upon receiving instructions from the control unit 215, may open and close valves so as to connect one or more of the first delivery system 205 or the second delivery system 206 to the plasma generation chamber 230 and direct a desired process gas through a manifold 216 into the plasma generation chamber 230.

In some embodiments, the plasma generation chamber 230 may include a transformer coupled plasma generator and may be, e.g., a coil. The coil may be attached to an RF generator 229 that is used to provide power to the plasma generation chamber (under control of the control unit 215) in order to ignite the plasma during introduction of the process gases and/or carrier gases. However, while the plasma generation chamber 230 is described above as including a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be used. All such methods are fully intended to be included within the scope of the embodiments.

The process chamber 203 also includes a showerhead 217 that is connected to the plasma generation chamber 230 by a conduit 218. The conduit 218 allows plasma products from the plasma generation chamber 230 (e.g., H radicals (H*) or other plasma products) to be transported into the showerhead 217. The showerhead 217 may be used to disperse the plasma products into the process chamber 203, and may be designed to evenly disperse the plasma products in order to minimize undesired process conditions that may arise from uneven dispersal. In an embodiment, the showerhead 217 may include a gas distribution plate (GDP) 240, which may have multiple openings 241 to allow for the dispersal of the plasma products into the process chamber 203. The different pore size of 241 from center to edge design could adjust the c-Si etching loading of the wafer on 201.

In some cases, H ions ($H^+$) may be formed in the plasma generation chamber 230 in addition to H radicals (H*). However, H ions impinging on silicon can cause damage or defects. Thus, reducing the amount of H ions entering the process chamber 203 can result in an improved results from the plasma clean 103. In some embodiments, the GDP 240 may be made of a conductive material (e.g., aluminum) and may be electrically grounded, and thus H ions that contact the GDP 240 may be neutralized, reducing the number of damaging H ions entering the process chamber 203. In some embodiments, optional magnetic filter 242 may be located at the conduit 218 to filter H ions from entering the showerhead 217. Because the H ions are positively charged and the H radicals are electrically neutral, a magnetic field will deflect the H ions while having less effect on the H radicals. Thus, the magnetic filter 242 is configured to produce a magnetic field that deflects the H ions within the conduit 218 such that fewer H ions reach the showerhead 217. The magnetic filter 242 may comprise one or more magnets, which may include one or more ring magnets encircling the conduit 218 or may include multiple magnets arranged in a ring around the conduit 218. Other configurations or arrangements of magnets are possible to achieve filtering of H ions. The magnets of the magnetic filter 242 may include permanent magnets, electromagnets, the like, or a combination thereof.

Turning to FIGS. 13B-G, different embodiments of showerheads 217 and GDPs 240 are shown. FIGS. 13B-E show embodiments of GDPs 240 and showerheads 217 configured to distribute plasma products (e.g. H radicals) more evenly within the process chamber 203. The embodiments shown in FIGS. 13B-G may be used in an etching system such as etching system 200. In some embodiments, a more even distribution of H radicals can provide a more uniform removal of etching residue 102 or more uniform etching by H radicals during a plasma clean 103. In some cases, the distribution of plasma products exiting the conduit 218 into the showerhead 217 remains concentrated near an axis aligned with the conduit 218. For example, the plasma products may be more concentrated near the center of the showerhead 217. Thus, because of the uneven distribution of plasma products exiting the showerhead 217, the plasma products may impinge on the semiconductor device 201 unevenly, causing, for example, uneven etching or cleaning during the plasma clean 103.

Figure 13A:
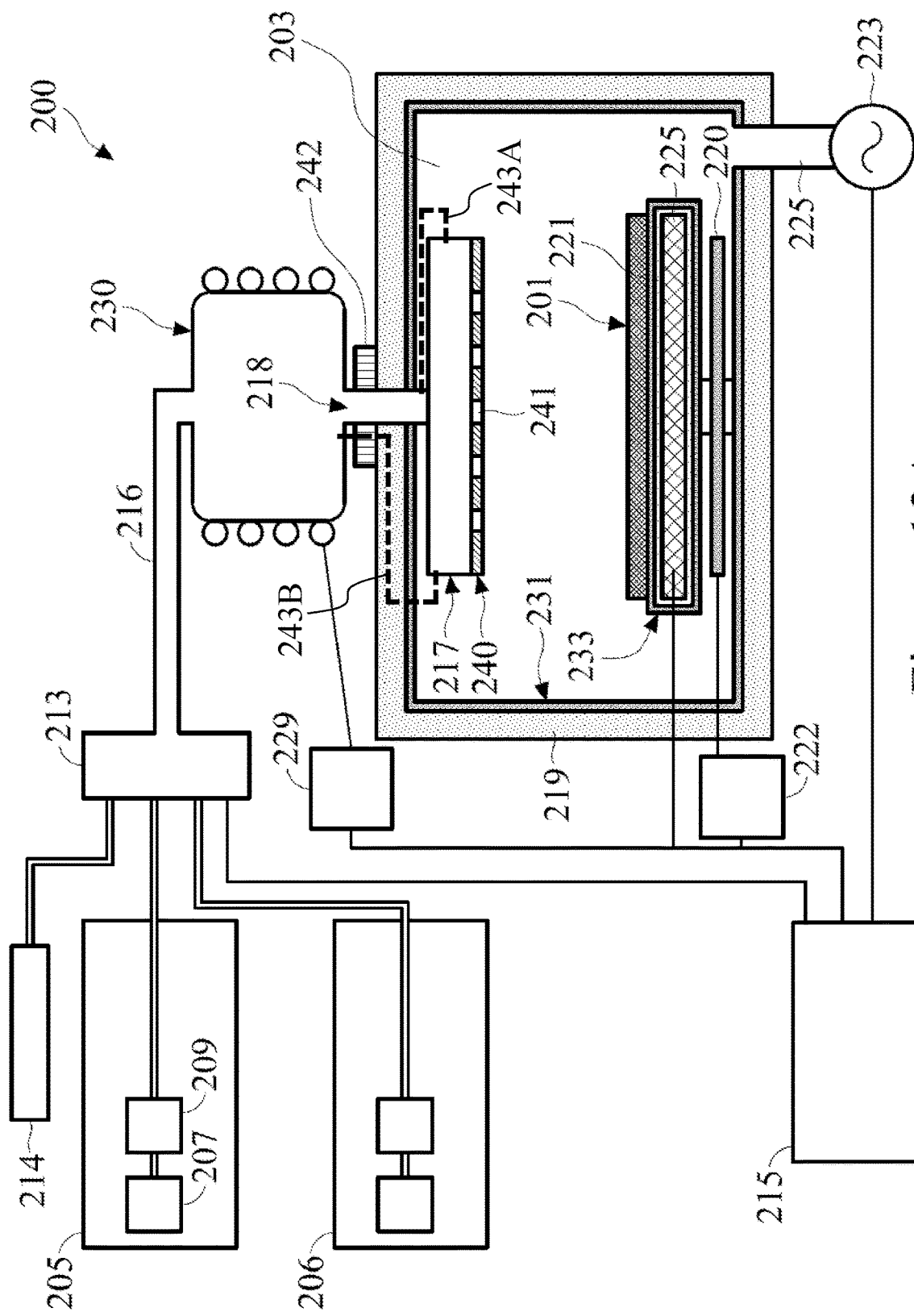
Figure 13B:
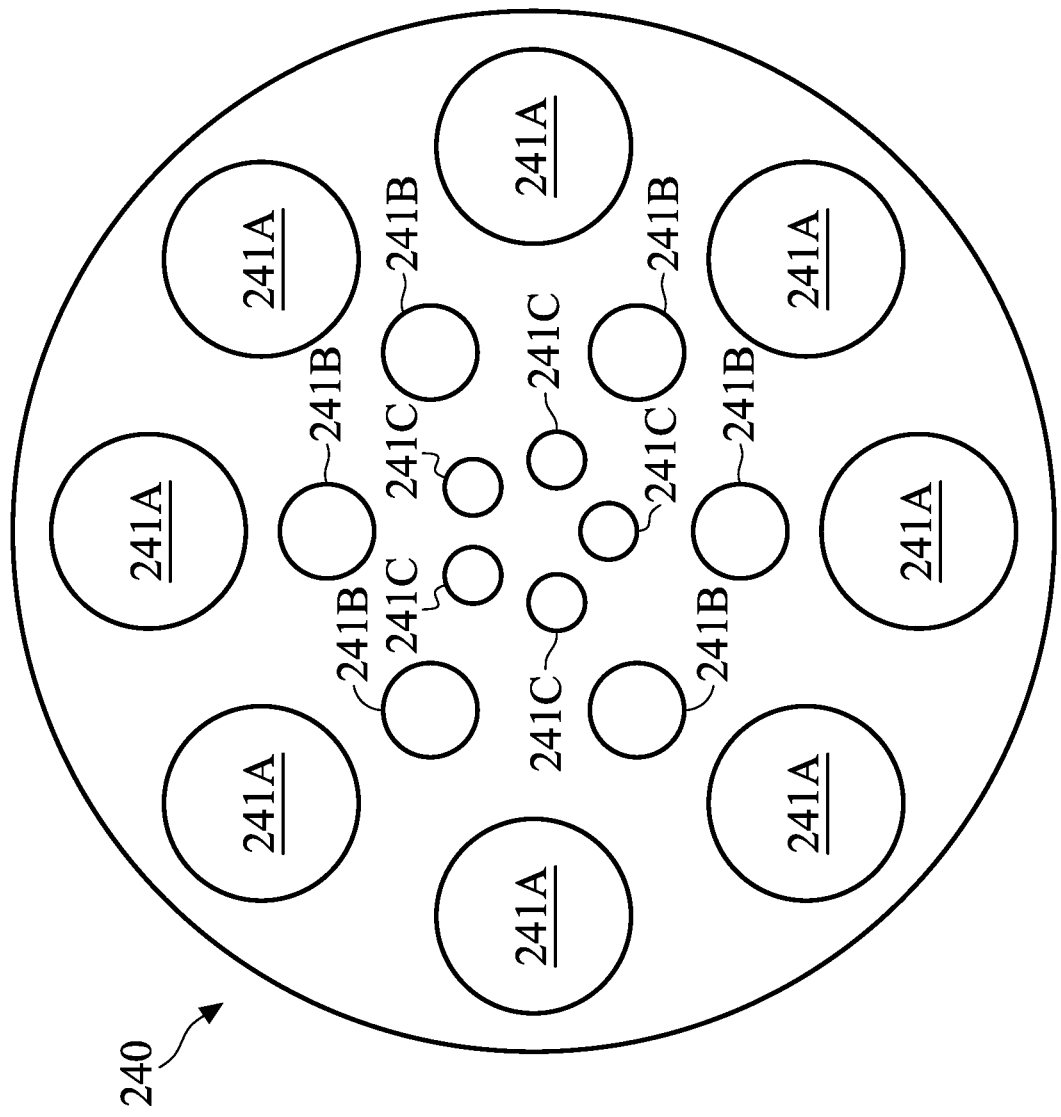

Turning to FIG. 13B, a GDP 240 with different sizes of openings 241 is shown, in accordance with some embodiments. In the embodiment shown in FIG. 13B, the GDP 240 includes openings 241 comprising three types of openings 241A-C that have three different sizes. Openings 241A have the largest diameter and are located near the edge of the GDP 240. Openings 241C have the smallest diameter and are located near the center of the GDP 240. Openings 241B have a diameter between that of openings 241C and 241A and are located between openings 241A and 241C. In some embodiments, openings 241A may have a diameter between about 40 mm and 60 mm, openings 241B may have a diameter between about 20 mm and about 30 mm, and openings 241C may have a diameter between about 5 mm and 10 mm.

The larger size of openings 241A near the edge of the GDP 240 allow more H radicals within the showerhead 217 to exit the showerhead 217 near the edge of the GDP 240. Additionally, the smaller size of openings 241A near the center of the GDP 240 allow fewer plasma products within the showerhead 217 to exit the showerhead 217 near the center of the GDP 240. Thus, if the plasma products that enter the showerhead 217 from the conduit 218 are distributed mostly near the center of the showerhead 217, a GDP 240 having an arrangement of differently-sized openings 241 similar to that shown in FIG. 13B can allow the plasma products to exit the showerhead 217 with a more even distribution. The openings 241 shown in FIG. 13B comprising openings 241A-C are meant as an illustrative example. The number of openings 241, the arrangement of openings 241, the number of different sizes of openings 241, the arrangement of openings 241, the relative sizes of openings 241, and other characteristics (e.g., shape, spacing, distribution, etc.) of the openings 241 may be different in other embodiments without deviating from the scope of this disclosure.

Figure 13C:
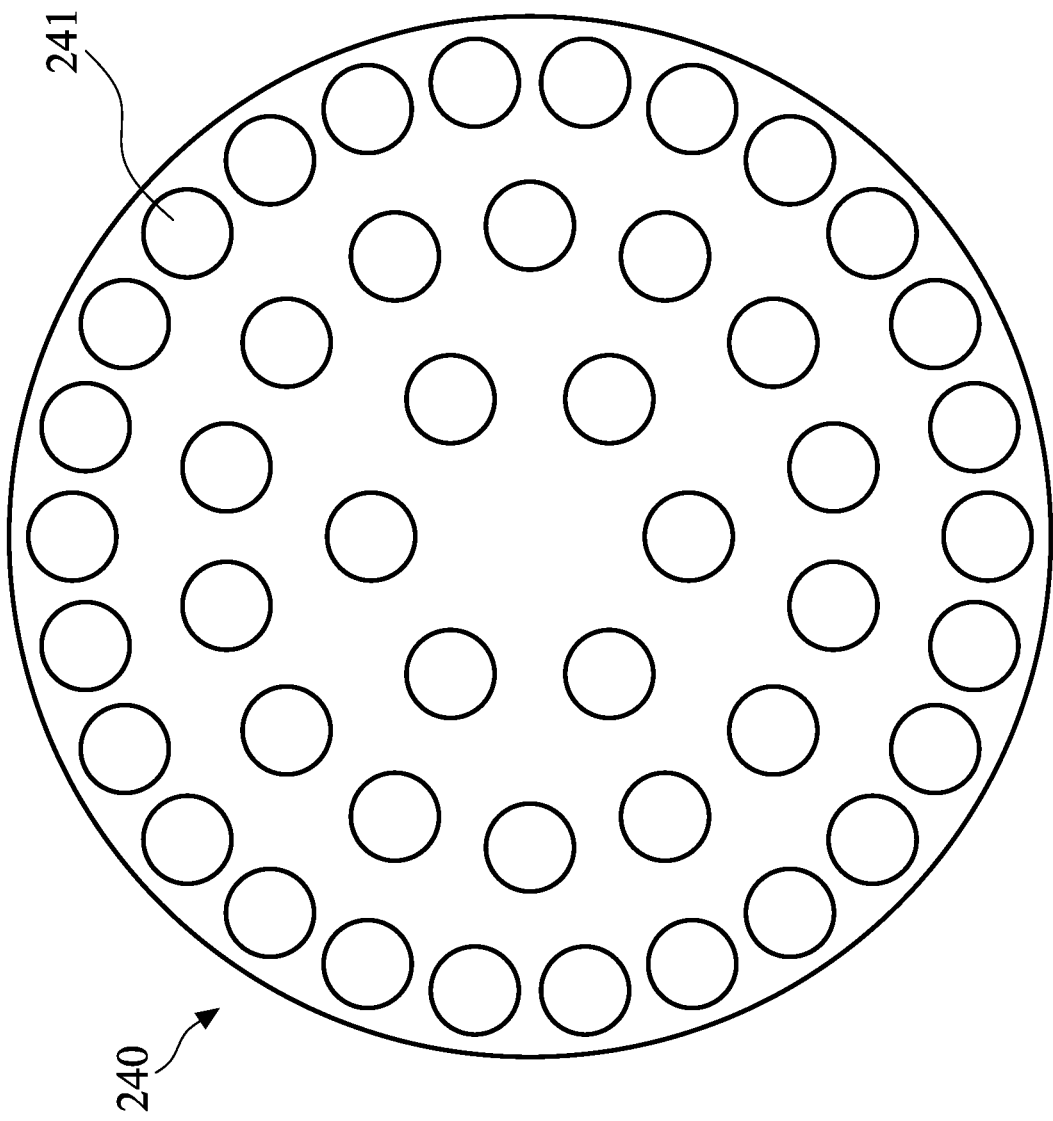

Turning to FIG. 13C, a GDP 240 with openings 241 having different densities in different regions is shown, in accordance with some embodiments. As shown in FIG. 13C, openings 241 near the center of the GDP 240 have a smaller density (e.g., greater spacing between openings) than the openings 241 near the edge of the GDP 240, which have a greater density (e.g., smaller spacing between openings).

The greater density of openings 241 near the edge of the GDP 240 allow more plasma products within the showerhead 217 to exit the showerhead 217 near the edge of the GDP 240. Additionally, the smaller density of openings 241 near the center of the GDP 240 allow fewer plasma products within the showerhead 217 to exit the showerhead 217 near the center of the GDP 240. Thus, if the plasma products that enter the showerhead 217 from the conduit 218 are distributed mostly near the center of the showerhead 217, an arrangement of differently-spaced openings 241 similar to that shown in FIG. 13C can allow the plasma products to exit the showerhead 217 with a more even distribution. The openings 241 shown in FIG. 13C are meant as an illustrative example. The number of openings 241, the arrangement of openings 241, the number of different sizes of openings 241, the arrangement of openings 241, the relative sizes of openings 241, and other characteristics (e.g., shape, spacing, distribution, etc.) of the openings 241 may be different in other embodiments without deviating from the scope of this disclosure.

Figure 13E:
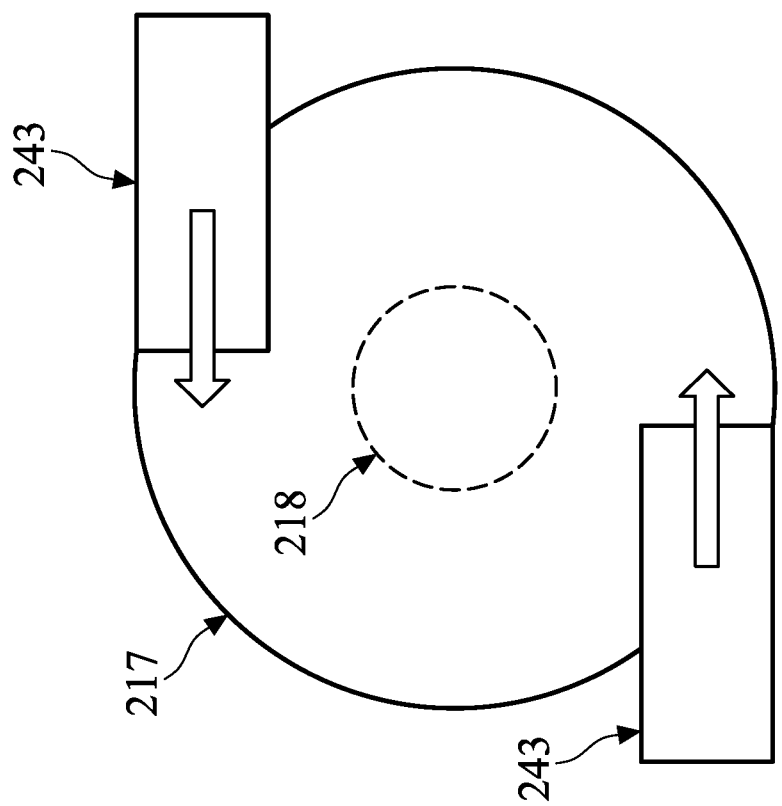

Turning to FIGS. 13D-E, showerheads 217 and secondary conduits 243 are shown, in accordance with some embodiments. In FIG. 13D, a plan view of a showerhead 217 is shown, which may be similar to showerheads 217 described previously. The showerhead 217 is connected to secondary conduits 243 that are configured to allow transport of plasma products from the plasma chamber 230 into the showerhead 217. For example, a secondary conduit 243 may be connected from the conduit 218 to the showerhead 217 (shown in FIG. 13A by secondary conduit 243A), or may be connected from the plasma chamber 230 to the showerhead 217 (shown in FIG. 13B by secondary conduit 243B). In some embodiments, the showerheads 217 and secondary conduits 243 shown in FIGS. 13D-E may be combined with other features, such as the GDPs 240 shown in FIGS. 13B-C or below in FIGS. 13F-G.

As shown in FIGS. 13D-E, the secondary conduits 243 are configured to transport plasma products laterally into the showerhead 217. This lateral transport of plasma products into the showerhead 217 by the secondary conduits 243 may be in addition to the vertical transport of plasma products into the showerhead 217 by the conduit 218. One or more secondary conduits 243 may be used to transport plasma products into the showerhead 217. By laterally injecting some plasma products from the secondary conduits 243 in addition to those from the conduit 218, the plasma products may be more evenly distributed within the showerhead 217, and thus the plasma products may exit the showerhead 217 with a more even distribution.

Turning to FIG. 13D, a showerhead 217 is shown having secondary conduits 243 arranged radially around the showerhead 217 (e.g., arranged to plasma products toward the center of the showerhead 217). Four secondary conduits 243 are shown in FIG. 13D, but in other embodiments, other numbers of secondary conduits 243 may be arranged around the showerhead 217, such as one, two, three, five, or more secondary conduits 243. The secondary conduits 243 may be evenly spaced around the showerhead 243 or unevenly spaced around the showerhead 217.

Turning to FIG. 13E, a showerhead 217 is shown having secondary conduits 243 having an offset arrangement around the showerhead 217. The offset secondary conduits 243 in FIG. 13E inject plasma products near the edge of the showerhead 217. In some cases, the secondary conduits 243 may cause the plasma products to swirl around the inside of the showerhead 217, creating a more even distribution of plasma products. The secondary conduits 243 may cause a swirl in a clockwise direction or in a counterclockwise direction, depending on the arrangement. Two secondary conduits 243 are shown in FIG. 13E, but in other embodiments, other numbers of secondary conduits 243 may be arranged around the showerhead 217, such as one, two, three, five, or more secondary conduits 243. The secondary conduits 243 may be evenly spaced around the showerhead 243 or unevenly spaced around the showerhead 217. The secondary conduits 243 may be offset a different amount or may inject plasma products at a different angle than shown in FIG. 13E.

Figure 13F:
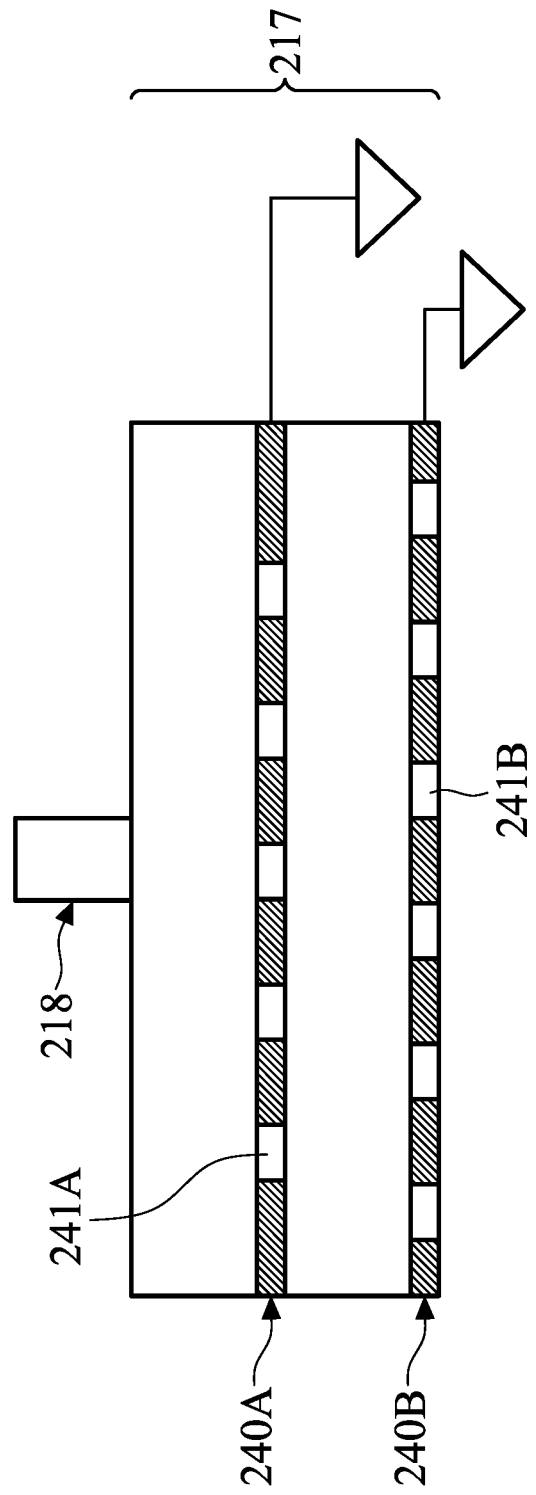
Figure 13G:
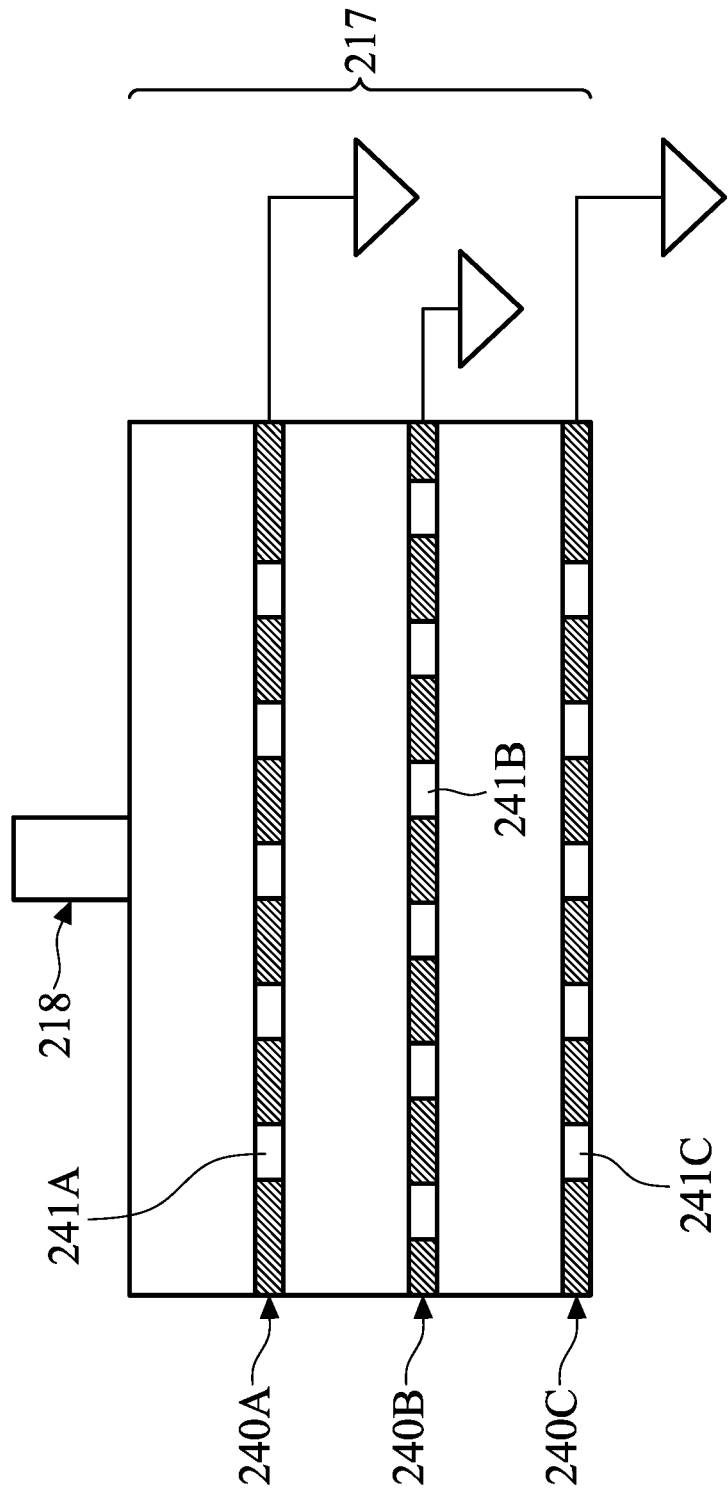

Turning to FIGS. 13F-G, showerheads 217 having multiple GDPs 240 are shown, in accordance with some embodiments. FIG. 13F shows a showerhead 217 having two GDPs 240A-B and FIG. 13G shows a showerhead 217 having three GDPs 240A-C, but other numbers of GDPs 240 may be present in other embodiments. The showerheads 217 shown in FIGS. 13F-G have multiple GDPs 240 with staggered openings 241 in order to reduce the amount of H ions that enter the plasma chamber 230 while still permitting H radicals to enter the plasma chamber 230. The showerheads 217 shown in FIGS. 13F-G include multiple GDPs 240 that are electrically grounded. Thus, H ions that contact any of the GDPs 240 within a showerhead 217 are neutralized. To increase the chance that an H ion comes in contact with a grounded GDP 240, the GDPs 240 within a showerhead 217 have staggered (e.g., misaligned) openings 240. Thus, the H ions have to flow a longer distance and along a curving path to reach the plasma chamber 230, and the likelihood of an H ion contacting a GDP 240 is increased.

Turning to FIG. 13F, a showerhead 217 with two GDPs 240A-B is shown. The first GDP 240A includes a set of openings 241A and the second GDP 240B includes a set of openings 241B. The openings 241B are oriented with respect to the openings 241A such that plasma products entering from the conduit 218 cannot exit the showerhead 217 by traveling in a straight line. For example, the locations of the openings 241A may be laterally offset from the openings 241B, as shown in FIG. 13F.

Turning to FIG. 13G, a showerhead 217 with three GDPs 240A-C is shown. The first GDP 240A includes a set of openings 241A, the second GDP 240B includes a set of openings 241B, and the third GDP 240C includes a set of openings 241C. By adding additional GDPs 240 with offset openings 241, the likelihood of an H ion contacting a grounded GDP 240 is further increased. As shown in FIG. 13G, the openings 241B are laterally offset from the openings 240A and the openings 241C. In some embodiments, the third GDP 240C may have openings 241C approximately aligned with the openings 241A of the first GDP 240A, but in other embodiments the openings 241A-C of all three GDPs 240A-C may be misaligned.

Within each GDP 240, the number of openings 241, the arrangement of openings 241, the number of different sizes of openings 241, the arrangement of openings 241, the relative sizes of openings 241, and other characteristics (e.g., shape, spacing, distribution, etc.) of the openings 241 may be different in other embodiments without deviating from the scope of this disclosure. Different GDPs 240 in a showerhead 217 may have different arrangements (e.g., positions, sizes, spacings) of openings 241. In some embodiments, the showerheads 217 and GDPs 240 shown in FIGS. 13F-G may be combined with other features, such as the GDPs 240 shown in FIGS. 13B-C or the secondary conduits 243 shown in FIGS. 13D-E.

However, the introduction of plasma products to the process chamber 203 through a single showerhead 217 or through a single point of introduction as described above is intended to be illustrative only and is not intended to be limiting to the embodiments. Any number of separate and independent showerheads 217 or other openings to introduce plasma products into the process chamber 203 may alternatively be used. All such combinations of showerheads and other points of introduction are fully intended to be included within the scope of the embodiments.

The process chamber 203 may receive the plasma products and expose the semiconductor device 201 to the plasma products. The process chamber 203 may be any desired shape that may be suitable for dispersing the plasma products and contacting the plasma products with the semiconductor device 201. The process chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, ceramic, combinations of these, and the like. In some embodiments, the interior of the housing 219 may be coated with a protective coating 231 that can withstand relatively high process temperatures (e.g., temperatures greater than about 300° C.). In some cases, the protective coating 231 decreases the amount of outgassing or contamination that may be released from the housing 219 under relatively high process temperatures. The protective coating 231 may include a material such as iron, nickel, cobalt, ceramic, combinations of these, and the like. In some cases, a housing 219 and/or protective coating 231 made of materials such as the examples above may also be less reactive to hydrogen radicals (H*), and thus less undesired reaction products may be formed or introduced into the process chamber 203 due to H* reacting with the material of the housing 219 or protective coating 231.

Within the process chamber 203, the semiconductor device 201 may be placed on a mounting platform 221 in order to position and control the semiconductor device 201 during the deposition processes. The mounting platform 221 may include a heating mechanism 225 in order to heat the semiconductor device 201 during the deposition processes (under control of the control unit 215). In some embodiments, the heating mechanism 225 is configured to generate a process temperature between about 100° C. and about 1000° C. The heating mechanism 225 may include a single heating element or the heating mechanism 225 may include multiple heating elements that may be individually or collectively controlled. Furthermore, while a single mounting platform 221 is illustrated in FIG. 13A, any number of mounting platforms 221 may additionally be included within the process chamber 203. Additionally, multiple wafers or semiconductor devices 201 may be placed on a single mounting platform 221.

In some embodiments, the mounting platform 221 may be formed from a material that is suited to tolerate relatively high process temperatures, such as process temperatures between about 100° C. and about 1000° C. For example, the mounting platform 221 may be made from an aluminum nitride material (e.g., $AlN_x$), another metal alloy material, or another suitable material. In some embodiments, the mounting platform 221 may be coated with a protective coating 233 that has a tolerance to high temperatures. In some embodiments, the protective coating 233 may include iron, nickel, cobalt, combinations of these, or the like. In some cases, the protective coating 231 of the housing 219 and the protective coating 233 of the mounting platform 221 may be the same material, though different materials may also be utilized. The protective coating 233 may protect the mounting platform 221 during a plasma process and also may reduce contamination within the process chamber 203 when the mounting platform 221 is at higher process temperatures. The mounting platform 221 may be configured to evenly distribute heat to a wafer or semiconductor devices mounted on the mounting platform 221.

Additionally, the process chamber 203 and the mounting platform 221 may be part of a cluster tool system (not shown). The cluster tool system may be used in conjunction with an automated handling system in order to position and place the semiconductor device 201 into the process chamber 203 prior to performing the plasma clean 103, position, hold the semiconductor device 201 during the plasma clean 103 or other processes, and remove the semiconductor device 201 from the process chamber 203 after the plasma clean 103 or other processes.

The mounting platform 221 may additionally include a first electrode 220 coupled to a first RF generator 222. The first electrode 220 may be electrically biased by the first RF generator 222 (under control of the control unit 215) at a RF voltage during the plasma clean 103 or other processes.

The process chamber 203 may also have an exhaust outlet 225 for exhaust material to exit the process chamber 203. A vacuum pump 223 may be connected to the exhaust outlet 225 of the process chamber 203 in order to help evacuate the exhaust material. The vacuum pump 223, under control of the control unit 215, may also be utilized to reduce and control the pressure within the process chamber 203 to a desired pressure and may also be used to evacuate exhaust materials or reaction byproducts from the process chamber 203.

Figure 14:
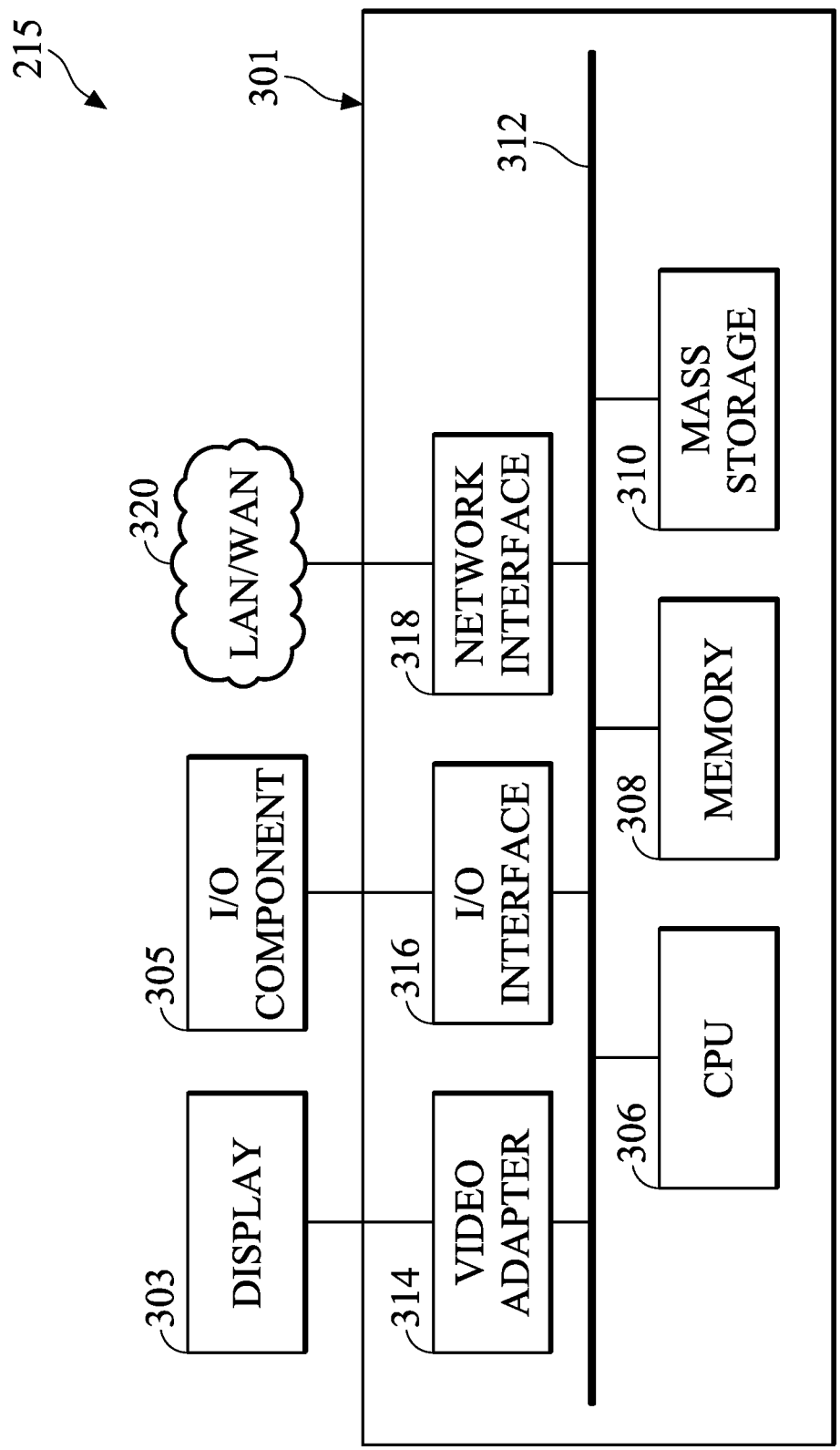
Figure 15B:
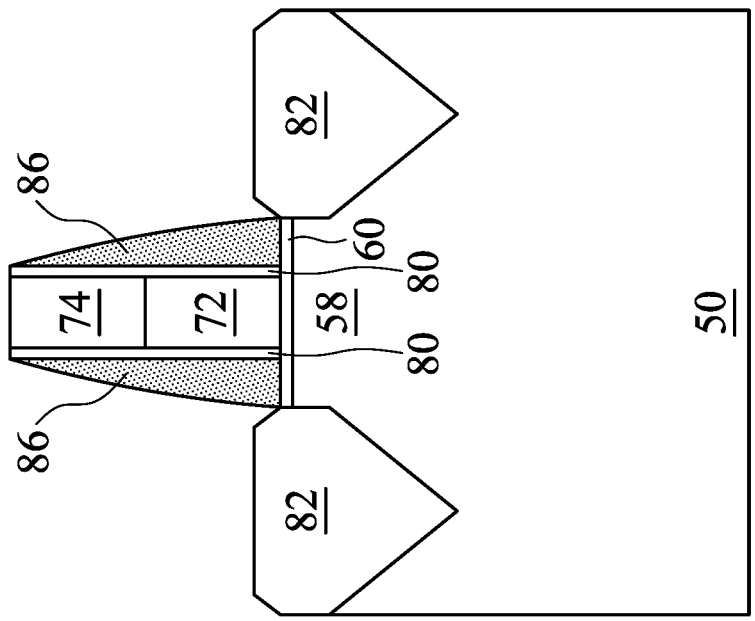
FIGS. 15A, 15B, 15C, 15D, 16A, 16B, 17A, 17B, 18A, 18B, 19A, 19B, 20A, 20B, 21A, and 21B are cross-sectional views of intermediate stages in the manufacturing of FinFETs, in accordance with some embodiments.
Figure 15A:
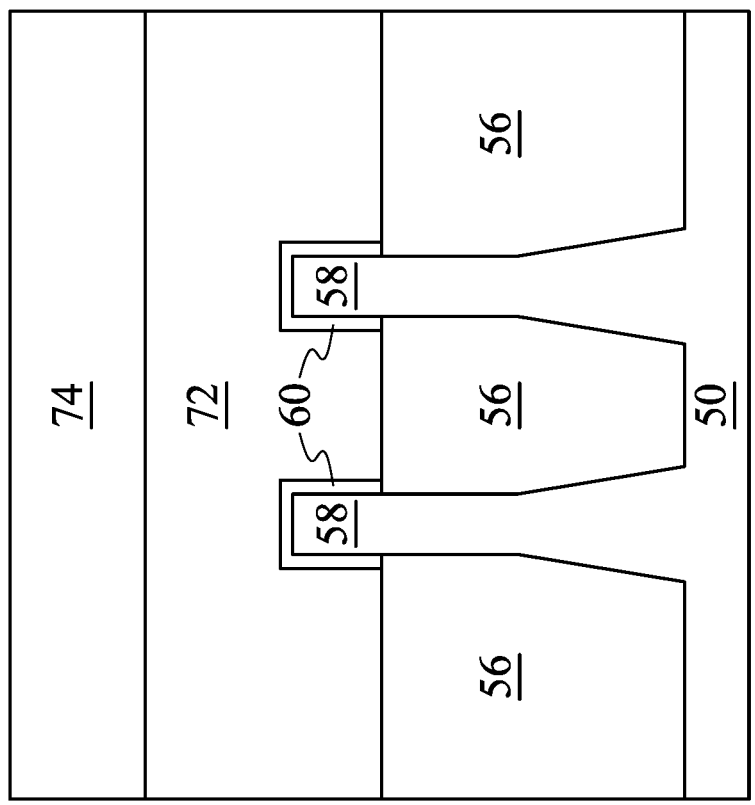
Figure 15C:
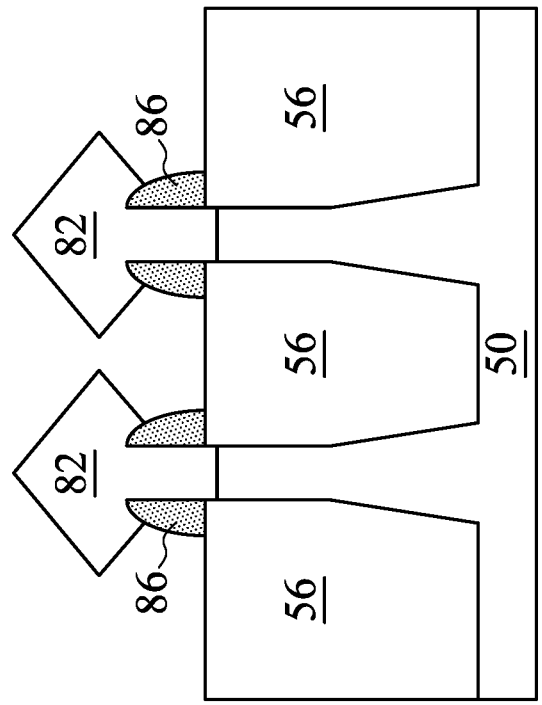
Figure 15D:
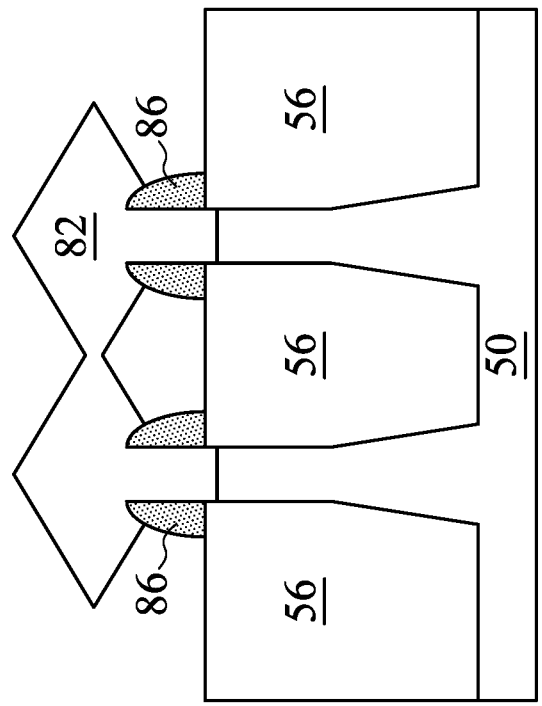

FIG. 14 illustrates an embodiment of the control unit 215 that may be utilized to control the gas controller 213 and the vacuum pump 223 (as illustrated in FIG. 13A). The control unit 215 may be any form of computer processor that can be used in an industrial setting for controlling process machines. In an embodiment, the control unit 215 may include a processing unit 301, such as a desktop computer, a workstation, a laptop computer, or a dedicated unit customized for a particular application. The control unit 215 may be equipped with a display 303 and one or more input/output components 305, such as instruction outputs, sensor inputs, a mouse, a keyboard, printer, combinations of these, or the like. The processing unit 301 may include a central processing unit (CPU) 306, memory 308, a mass storage device 310, a video adapter 314, and an I/O interface 316 connected to a bus 312.

The bus 312 may be one or more of any type of several bus architectures including a memory bus or memory controller, a peripheral bus, or video bus. The CPU 306 may include any type of electronic data processor, and the memory 308 may include any type of system memory, such as static random access memory (SRAM), dynamic random access memory (DRAM), or read-only memory (ROM). The mass storage device 310 may include any type of storage device configured to store data, programs, and other information and to make the data, programs, and other information accessible via the bus 312. The mass storage device 310 may include, for example, one or more of a hard disk drive, a magnetic disk drive, or an optical disk drive.

The video adapter 314 and the I/O interface 316 provide interfaces to couple external input and output devices to the processing unit 301. As illustrated in FIG. 14, examples of input and output devices include the display 303 coupled to the video adapter 314 and the I/O component 305, such as a mouse, keyboard, printer, and the like, coupled to the I/O interface 316. Other devices may be coupled to the processing unit 301, and additional or fewer interface cards may be utilized. For example, a serial interface card (not shown) may be used to provide a serial interface for a printer. The processing unit 301 also may include a network interface 318 that may be a wired link to a local area network (LAN) or a wide area network (WAN) 320 and/or a wireless link.

It should be noted that the control unit 215 may include other components. For example, the control unit 215 may include power supplies, cables, a motherboard, removable storage media, cases, and the like. These other components, although not shown in FIG. 14, are considered part of the control unit 215.

The etching system 200 is an example system that can be used to perform the plasma clean 103, and other systems to perform the plasma clean 103 are within the scope of this disclosure. In some embodiments, the etching system 200 may be used to perform other processing steps on a semiconductor device 201 in addition to the plasma clean 103, such as additional etching steps or deposition steps. For example, the etching system 200 may be used to etch the recesses 101, to form epitaxial source/drain regions 82, or to perform other processing steps. In this manner, the semiconductor device 201 may remain within the process chamber 203 before or after the plasma clean 103. The etching system 200 may be configured as appropriate to perform these processing steps.

Turning now to FIGS. 15A-D, epitaxial source/drain regions 82 are formed in the recesses 101 or in the reshaped recesses 104. The epitaxial source/drain regions 82 in NMOS regions (e.g., region 50B) may be formed before or after formation of the epitaxial source/drain regions 82 in PMOS regions (e.g., region 50C). The recesses 101 or the reshaped recesses 104 as described may be formed in NMOS regions and/or in PMOS regions. In some embodiments, the recesses 101 or the reshaped recesses 104 may be formed simultaneously in NMOS regions and in PMOS regions. In some embodiments, the epitaxial source/drain regions 82 may extend into the fins 58. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. The epitaxial source/drain regions 82 in the region 50B, e.g., the NMOS region, may be formed by masking the region 50C, e.g., the PMOS region, and etching source/drain regions of the fins 58 in the region 50B form recesses in the fins 58. For example, a patterning process may be used to form a U-shaped recess similar to recess 101 (see FIG. 10) and then a plasma clean 103 may be performed. In some embodiments, the plasma clean 103 may reshape the recess 101 into a reshaped recess 104 (see FIG. 12). Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C are etched to form recesses in the fins 58. For example, a patterning process may be used to form a U-shaped recess similar to recess 101 (see FIG. 10) and then a plasma clean 103 may be performed. In some embodiments, the plasma clean 103 may reshape the recess 101 into a reshaped recess 104 (see FIG. 12). Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may include SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same FinFET to merge as illustrated by FIG. 15C. In other embodiments, adjacent source/drain regions 82 remain separated after the epitaxy process is completed as illustrated by FIG. 15D.

Figure 16B:
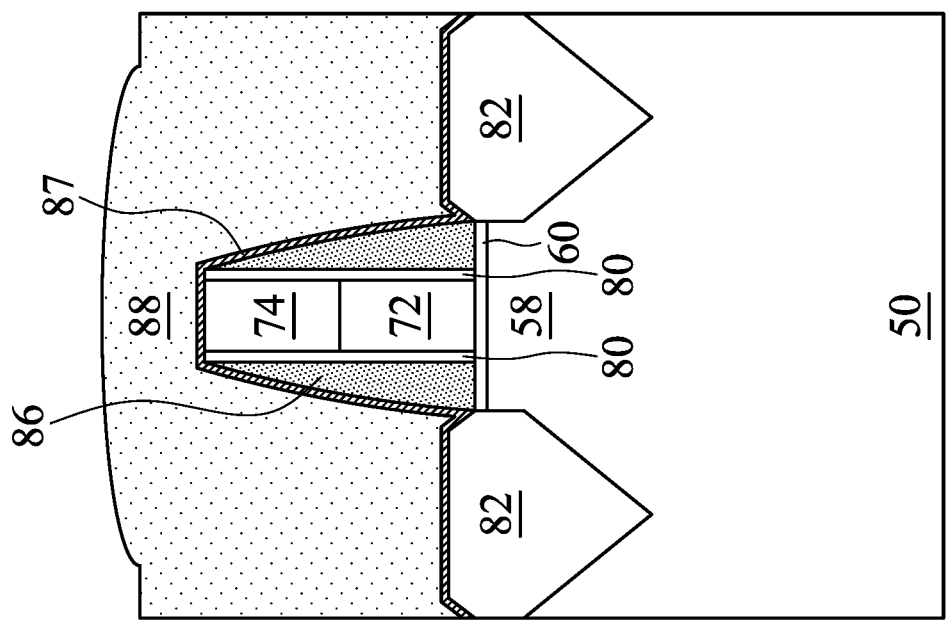
Figure 16A:
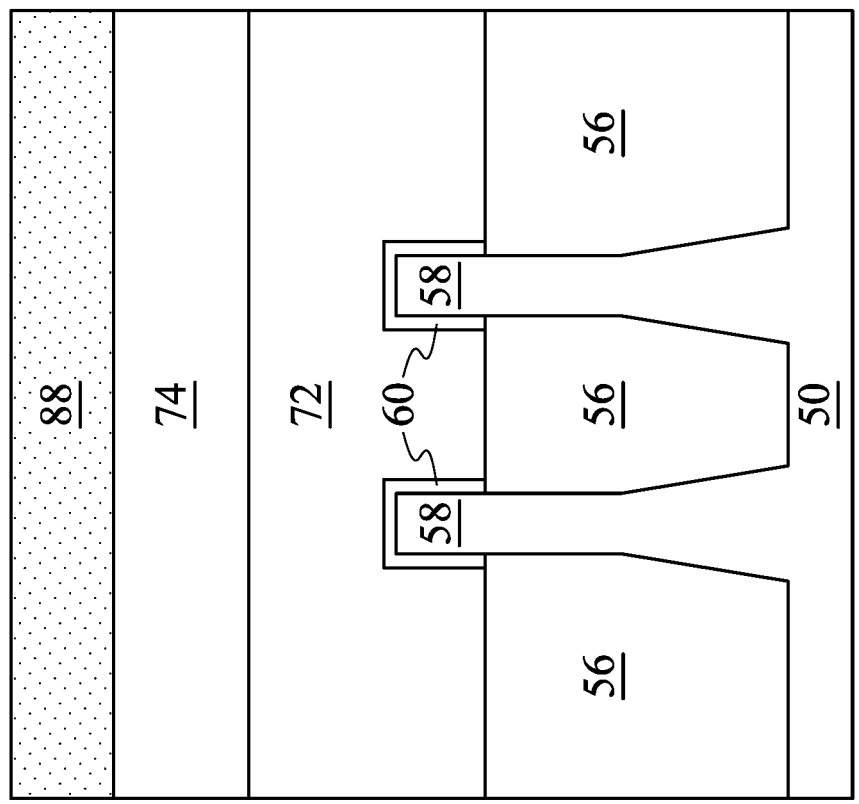

In FIGS. 16A-B, an ILD 88 is deposited over the structure illustrated in FIGS. 10A and 10B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL) 87 is disposed between the ILD 88 and the epitaxial source/drain regions 82, the hard mask 74, and the gate spacers 86. The CESL 87 may include a dielectric material, such as, silicon nitride, silicon oxide, silicon ox nitride, or the like.

Figure 17B:
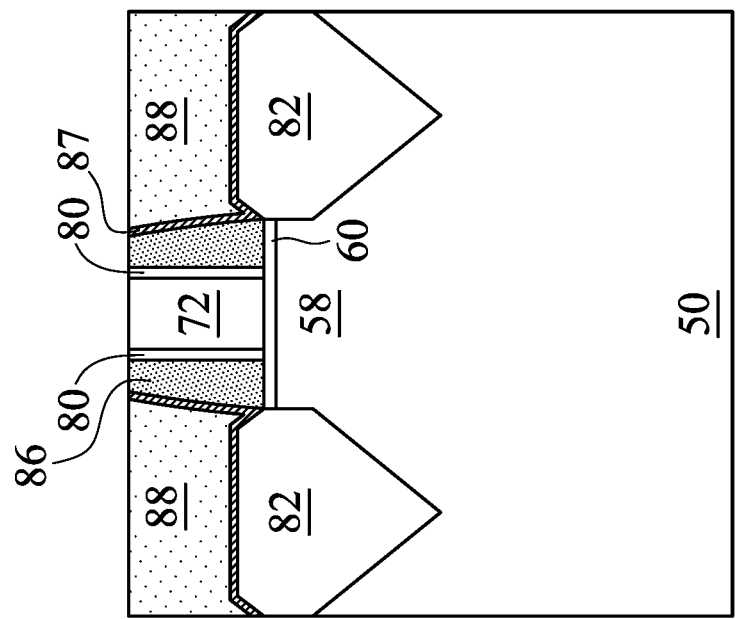
Figure 17A:
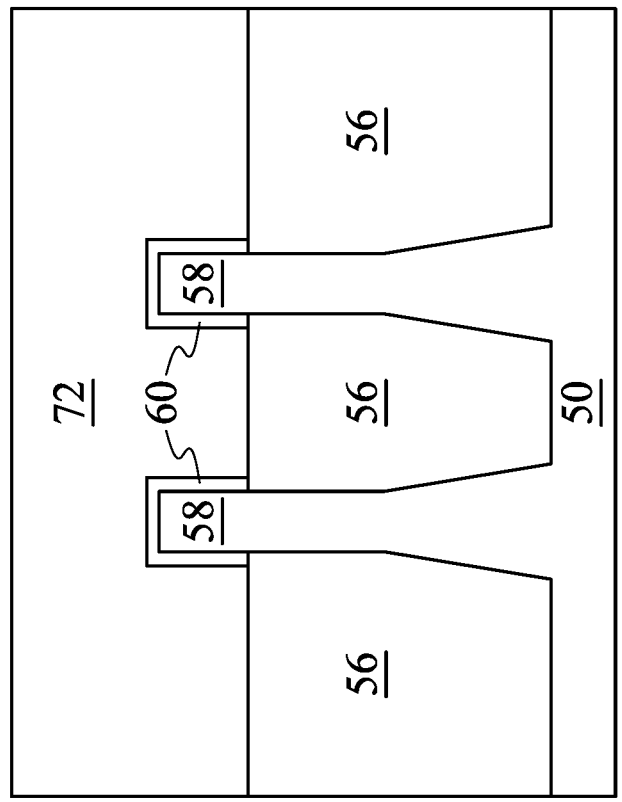

In FIGS. 17A-B, a planarization process, such as a CMP, may be performed to level the top surface of the ILD 88 with the top surfaces of the dummy gates 72. In an embodiment, the planarization process is performed using the planarization system 200. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 18B:
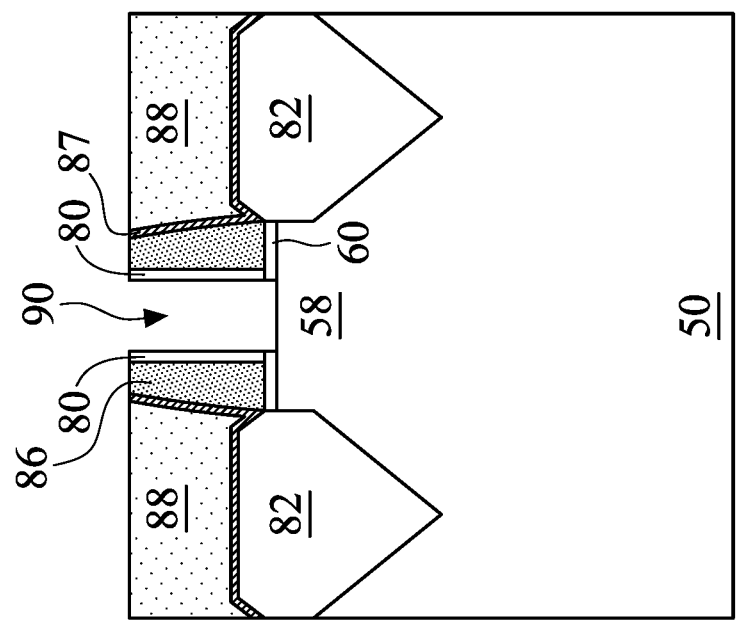
Figure 18A:
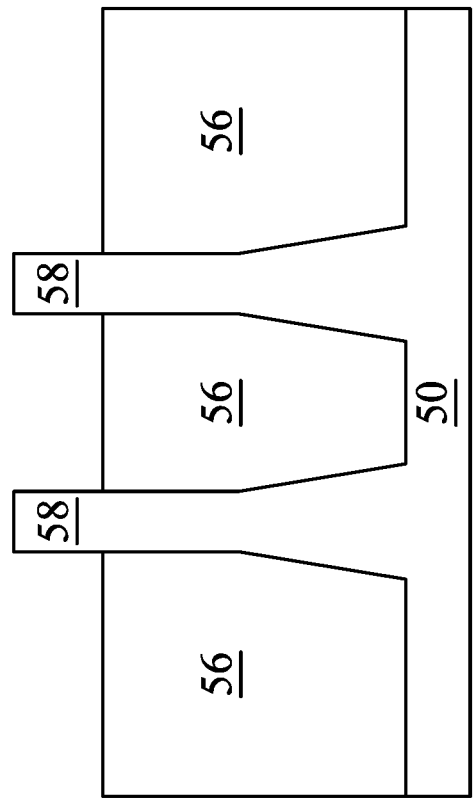

In FIGS. 18A-B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72.

Figures 19A, 19B:
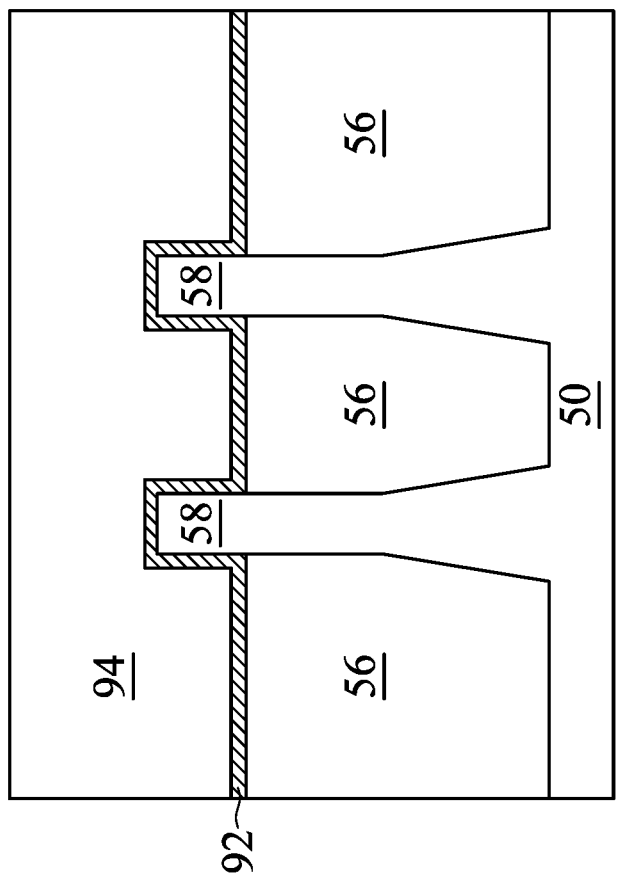

In FIGS. 19A-B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 include silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, Ag, Au, W, Ni, Ti, Cu, combinations thereof, or multi-layers thereof. In some embodiments, any number of work function layers 93 may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate" or a "gate stack." The gate and the gate stacks may extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 20B:
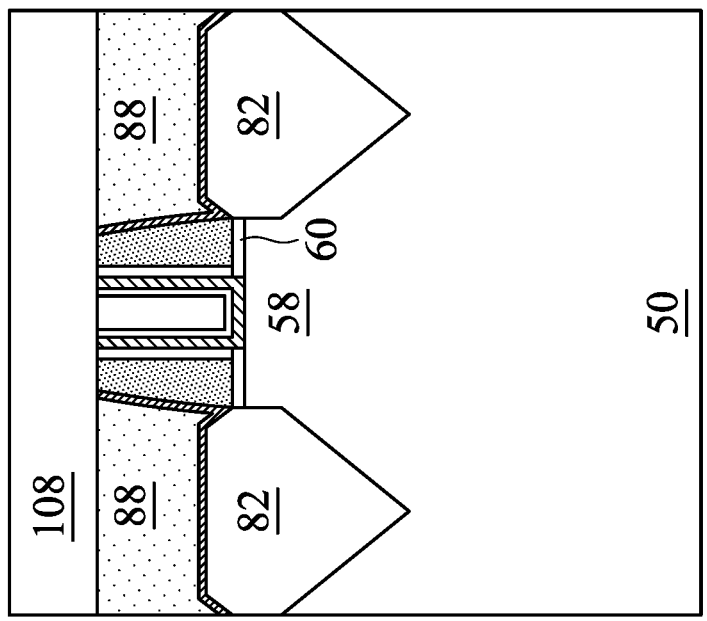
Figure 20A:
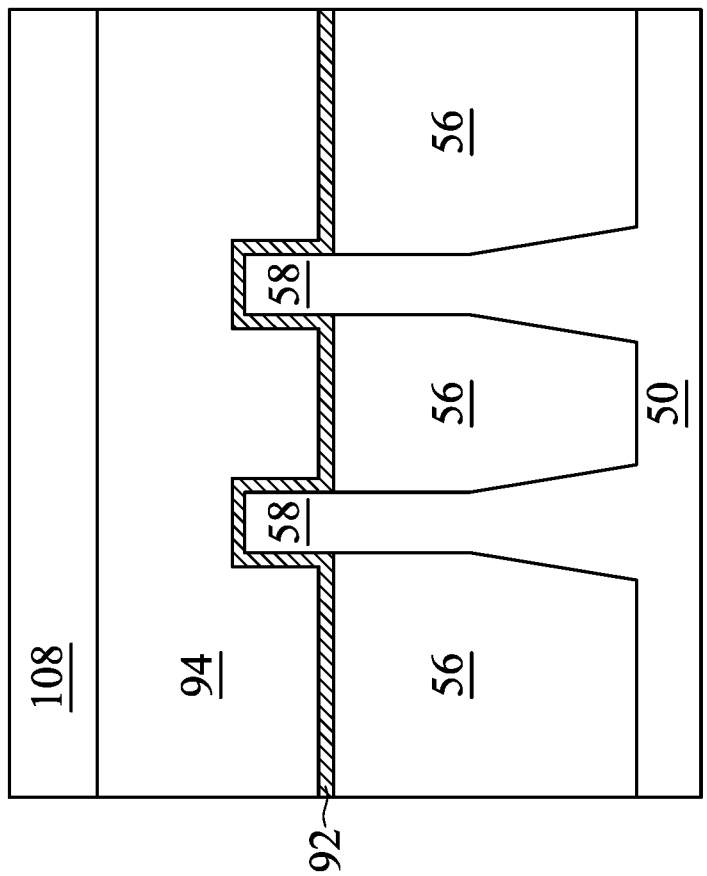

In FIGS. 20A-B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 21B:
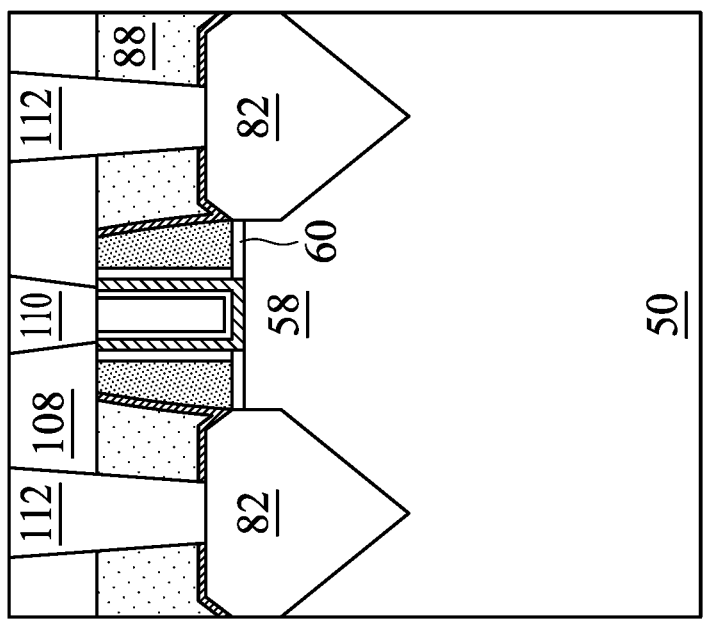
Figure 21A:
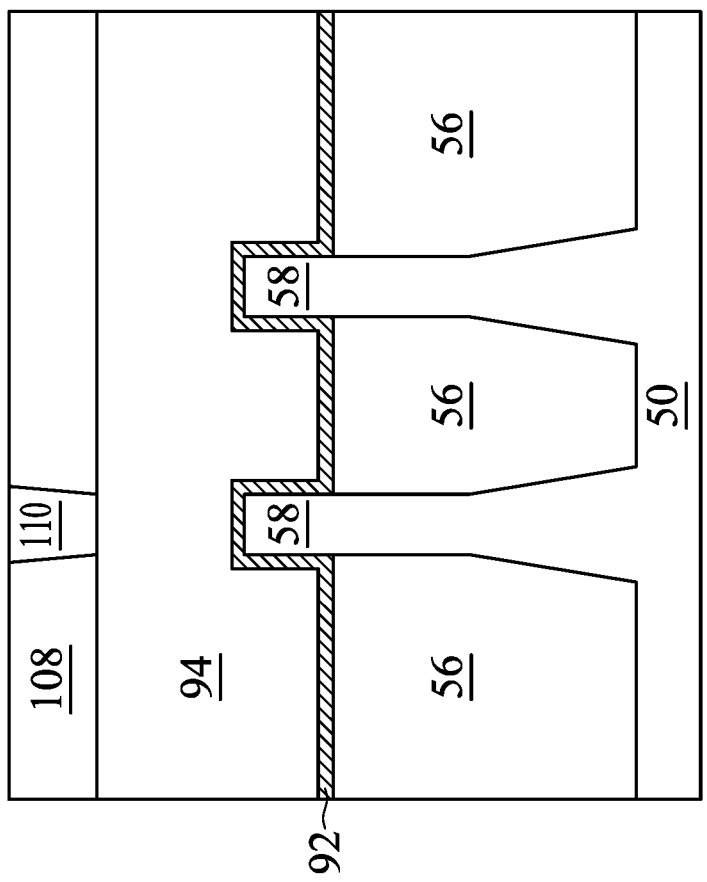

In FIGS. 21A-B, contacts 110 and 112 are formed through the ILD 108 and the ILD 88 using embodiment contact formation processes as discussed below with respect to FIGS. 17 through 29. In some embodiments, an anneal process may be performed to form a silicide at the interface between the epitaxial source/drain regions 82 and the contacts 112 prior to the contacts 112 being formed. The contact 110 is physically and electrically connected to the gate electrode 94, and the contacts 112 are physically and electrically connected to the epitaxial source/drain regions 82. FIGS. 20A-B illustrate the contacts 110 and 112 in a same cross-section; however, in other embodiments, the contacts 110 and 112 may be disposed in different cross-sections. Further, the position of contacts 110 and 112 in FIGS. 20A-B are merely illustrative and not intended to be limiting in any way. For example, the contact 110 may be vertically aligned with the fin 58 as illustrated or may be disposed at a different location on the gate electrode 94. Furthermore, the contacts 112 may be formed prior to, simultaneously with, or after forming the contacts 110.

The techniques described herein may achieve advantages. By cleaning recesses using a plasma cleaning process including H radicals and a process temperature above about 300° C., more contamination or residue (such as carbon or oxygen contamination) may be removed from the recesses with less loss of fin material due to etching. Additionally, the H radicals may reshape the recesses to have a bottom surface with improved bottom proximity, which can reduce problematic short-channel or DIBL effects. In some cases, the reshaped recesses can allow for improved current in the eventually formed FinFET device.

In accordance with an embodiment, a method includes forming a fin over a substrate, forming an isolation region adjacent the fin, forming a dummy gate structure over the fin, and recessing the fin adjacent the dummy gate structure to form a first recess using a first etching process. The method also includes performing a plasma clean process on the first recess, the plasma clean process including placing the substrate on a holder disposed in a process chamber, heating the holder to a process temperature between 300° C. and 1000° C., introducing hydrogen gas into a plasma generation chamber connected to the process chamber, igniting a plasma within the plasma generation chamber to form hydrogen radicals, and exposing surfaces of the recess to the hydrogen radicals. The method also includes epitaxially growing a source/drain region in the first recess. In an embodiment, the plasma clean process selectively etches crystalline planes of the fin having a first crystalline orientation over second crystalline planes of the fin having a second crystalline orientation. In an embodiment, the second crystalline planes have a (111) crystalline orientation. In an embodiment, the plasma clean process reshapes the first recess to form a reshaped first recess, wherein the reshaped first recess includes a first sidewall surface opposite a second sidewall surface, wherein the first sidewall surface and the second sidewall surface comprise crystalline planes, wherein the bottom of the reshaped first recess is defined by an intersection of a crystalline plane of the first sidewall surface and a crystalline plane of the second sidewall surface. In an embodiment, the plasma clean process removes between 70% and 90% of carbon contaminants from the first recess. In an embodiment, the plasma clean process includes setting a process pressure of the process chamber to between 0.1 Torr and 4 Torr. In an embodiment, the plasma clean process increases the lateral width of the first recess.

In accordance with an embodiment, method includes patterning a substrate to form a fin, the fin including a first semiconductor material, forming an isolation region along a sidewall of the fin, an upper portion of the fin extending above a top surface of the isolation region, forming a dummy gate structure along sidewalls and a top surface of the upper portion of the fin, performing a first plasma etching process on an exposed portion of the upper portion of the fin to form a first recess, the exposed portion of the fin being exposed by the dummy gate structure, after performing the first plasma etching process, performing a second plasma etching process on the first recess to form a second recess, wherein the first plasma etching process is different than the second plasma etching process, and epitaxially growing a source/drain region in the second recess. In an embodiment, the second plasma etching process removes residue from sidewalls of the first recess using hydrogen radicals. In an embodiment, the second plasma etching process is selective to first crystalline planes of the first semiconductor material having a first orientation relative to second crystalline planes of the first semiconductor material having a second orientation, wherein the first orientation is a (100) orientation and wherein the second orientation is a (110) orientation. In an embodiment, the second plasma etching process reshapes the first recess to have a V-shaped bottom surface, the V-shaped bottom surface including intersecting (111) crystalline planes. In an embodiment, the first plasma etching process uses a first etching gas, and the second plasma etching process uses a second etching gas different from the first etching gas. In an embodiment, the second etching gas includes $H_2$. In an embodiment, the second plasma etching process includes a process temperature between 300° C. and 1000° C. In an embodiment, the second plasma etching process etches silicon at a rate less than 0.5 Å/min. In an embodiment, the residue includes silicon oxide.

In accordance with an embodiment, a system for performing a plasma cleaning process includes a plasma generation chamber connected to a process chamber, and a holder disposed within the process chamber and configured to hold a wafer, the holder including a heating element, wherein the heating element generates a process temperature within the process chamber between 300° C. and 1000° C. during the plasma cleaning process. In an embodiment, the system further includes a source of hydrogen gas connected to the plasma generation chamber, the plasma generation chamber configured to generate hydrogen radicals from the hydrogen gas. In an embodiment, the holder includes a holder material tolerant to a process temperature of 1000° C. In an embodiment, the holder material includes an aluminum nitride material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for performing a plasma cleaning process, comprising:
    a process chamber;
    a plasma generation chamber separated from the process chamber;
    a showerhead located within the process chamber, wherein the showerhead is connected to the plasma generation chamber by a plurality of conduits, wherein the showerhead comprises a stack of gas distribution plates, wherein each gas distribution plate is separated from the process chamber, wherein each gas distribution plate is laterally separated from interior sidewalls of the process chamber, wherein each gas distribution plate comprises a plurality of openings, wherein the plurality of openings of each gas distribution plate are laterally offset from the plurality of openings of a neighboring gas distribution plate, wherein each gas distribution plate is electrically grounded; and
    a holder disposed within the process chamber and configured to hold a wafer, the holder comprising a heating element, wherein the heating element is configured to generate a process temperature within the process chamber between 300° C. and 1000° C. during the plasma cleaning process.

2. The system of claim 1 further comprising a source of hydrogen gas connected to the plasma generation chamber, wherein the plasma generation chamber is configured to generate hydrogen radicals from the hydrogen gas.

3. The system of claim 1, wherein the holder comprises a holder material tolerant to a process temperature of 1000° C.

4. The system of claim 3, wherein the holder material comprises an aluminum nitride material.

5. The system of claim 1, wherein at least one gas distribution plate comprises openings that are more closely spaced in regions near an edge of that gas distribution plate than in regions near a center of that gas distribution plate.

6. The system of claim 1, wherein the plurality of openings of at least one gas distribution plate comprises first openings having a first diameter in first regions near an edge of that gas distribution plate and second openings having a second diameter in second regions near a center of that gas distribution plate, wherein the first diameter is different from the second diameter, wherein the second regions near the center of that gas distribution plate are free of the first openings.

7. The system of claim 6, wherein the first diameter is greater than the second diameter.

8. The system of claim 6, wherein the plurality of openings of that gas distribution plate further comprises third openings having a third diameter in third regions between the first regions and the second regions, wherein the third diameter is between the first diameter and the second diameter.

9. A system, comprising:
a plasma generation chamber operable to ignite a gas within into plasma products;
a process chamber separated from the plasma generation chamber, wherein interior surfaces of the process chamber are coated in a metallic protective material;
a showerhead within the process chamber, wherein the showerhead comprises a gas distribution plate at a bottom side of the showerhead;
a primary conduit coupled to the plasma generation chamber and to a top side of the showerhead, wherein the primary conduit is configured to introduce plasma products from the plasma generation chamber into the showerhead at the top of the showerhead;
a plurality of secondary conduits coupled to the plasma generation chamber and to a sidewall of the showerhead, wherein the plurality of secondary conduits are configured to transport plasma products from the plasma generation chamber into the showerhead at the sidewall of the showerhead; and
a platform within the process chamber, wherein the platform is coated in the metallic protective material.

10. The system of claim 9, wherein the plurality of secondary conduits are coupled to the primary conduit.

11. The system of claim 9, wherein the plurality of secondary conduits are coupled to the plasma generation chamber.

12. The system of claim 9, wherein the secondary conduits are arranged radially around the sidewall of the showerhead.

13. The system of claim 9, wherein the secondary conduits direct the plasma products toward a center of the showerhead.

14. The system of claim 9, wherein the secondary conduits direct the plasma products in directions that are laterally offset from a center of the showerhead.

15. The system of claim 9, wherein the gas distribution plate comprises openings that have a greater density near an edge of the gas distribution plate than near a center of the gas distribution plate.

16. The system of claim 9, wherein the metallic protective material comprises iron, nickel, or cobalt.

17. A plasma etching system, comprising:
a hydrogen gas supply connected to a plasma generator chamber, wherein the plasma generator chamber is configured to generate plasma products from hydrogen gas, wherein the plasma products comprise hydrogen radicals and hydrogen ions;
a showerhead comprising a plurality of distribution plates, wherein neighboring distribution plates are vertically separated, wherein each distribution plate comprises a plurality of apertures arranged in a plurality of concentric ring formations, wherein each distribution plate is electrically grounded, wherein the showerhead is configured to filter hydrogen ions out of the plasma products;
a first conduit physically connected to a first surface of the showerhead, wherein the first conduit is configured to transport plasma products from the plasma generator chamber to the plurality of distribution plates within the showerhead;
a second conduit physically connected to a second surface of the showerhead, wherein the second conduit is configured to transport plasma products from the plasma generator chamber to the plurality of distribution plates within the showerhead.

18. The plasma etching system of claim 17 further comprising a magnetic filter coupled to the first conduit.

19. The plasma etching system of claim 17, wherein the first surface is perpendicular to the second surface.

20. The plasma etching system of claim 17, wherein the plurality of distribution plates comprises at least three distribution plates.

* * * * *